(12) United States Patent
Tsujikawa et al.

(10) Patent No.: US 7,863,125 B2
(45) Date of Patent: Jan. 4, 2011

(54) MANUFACTURING METHOD OF CMOS TYPE SEMICONDUCTOR DEVICE, AND CMOS TYPE SEMICONDUCTOR DEVICE

(75) Inventors: Shimpei Tsujikawa, Tokyo (JP); Yasuhiko Akamatsu, Tokyo (JP); Hiroshi Umeda, Tokyo (JP); Jiro Yugami, Tokyo (JP); Masaharu Mizutani, Tokyo (JP); Masao Inoue, Tokyo (JP); Junichi Tsuchimoto, Tokyo (JP); Kouji Nomura, Hyogo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/492,648

(22) Filed: Jun. 26, 2009

(65) Prior Publication Data

US 2009/0263945 A1    Oct. 22, 2009

Related U.S. Application Data

(62) Division of application No. 11/409,081, filed on Apr. 24, 2006, now Pat. No. 7,569,890.

(30) Foreign Application Priority Data

Jun. 7, 2005    (JP)    ............................. 2005-166609

(51) Int. Cl.
    *H01L 21/8238*    (2006.01)
(52) U.S. Cl. ........................................ 438/199; 257/369
(58) Field of Classification Search .................. 257/369; 438/199

See application file for complete search history.

(56) References Cited

U.S. PATENT DOCUMENTS 4,847,213 A * 7/1989 Pfiester ........................ 438/440

(Continued)

FOREIGN PATENT DOCUMENTS

JP    08-316465    11/1996

(Continued)

OTHER PUBLICATIONS

N. Kimizuka, et al, "NBTI enhancement by nitrogen incorporation into ultrathin gate oxide for 0.10- μm gate CMOS generation", Symposium on VLSI Technology Digest of Technical Papers 2000, 2 pages.

(Continued)

*Primary Examiner*—Eugene Lee
*Assistant Examiner*—Anthony Ho
(74) *Attorney, Agent, or Firm*—Oblon, Spivak, McClelland, Maier & Neustadt, L.L.P.

(57) ABSTRACT

The manufacturing method of the CMOS type semiconductor device which can suppress the boron penetration from the gate electrode of the pMOS transistors to the semiconductor substrate in the case that boron is contained in the gate electrodes, while enabling the improvement in the NBTI lifetime of the pMOS transistors, without degrading the performance of the nMOS transistors, is offered. The manufacturing method of the CMOS type semiconductor device concerning the present invention has the following process steps. Halogen is introduced to the semiconductor substrate of pMOS transistor formation areas. Next, a gate insulating film is formed on the semiconductor substrate of the pMOS transistor formation areas. Next, nitrogen is introduced to the gate insulating film.

7 Claims, 22 Drawing Sheets

U.S. PATENT DOCUMENTS

| | | |
|---|---|---|
| 6,130,164 A | 10/2000 | Gardner et al. |
| 6,541,321 B1 | 4/2003 | Buller et al. |
| 2004/0029350 A1 | 2/2004 | Robertson |
| 2005/0274948 A1 | 12/2005 | Tamura et al. |
| 2006/0043369 A1 | 3/2006 | Varghese et al. |
| 2006/0115940 A1 | 6/2006 | Kim et al. |

FOREIGN PATENT DOCUMENTS

| | | |
|---|---|---|
| JP | H11-260813 | 9/1999 |
| JP | 2000-243960 | 9/2000 |
| JP | 2001-237325 | 8/2001 |
| JP | 2001-244345 | 9/2001 |
| JP | 2001-291865 | 10/2001 |
| JP | 2001-351917 | 12/2001 |
| JP | 2002-009280 | 1/2002 |
| JP | 2002-217312 | 8/2002 |
| JP | 2004-281690 | 10/2004 |
| JP | 2006-156954 | 6/2006 |

OTHER PUBLICATIONS

Takayuki Aoyama, et al, "Effect of fluorine on boron diffusion in thin silicon dioxides and oxynitride", Journal of Applied Physics vol. 77(1), Jan. 1995, pp. 417-419.

Japanese Office Action with English translation dated Aug. 3, 2010 in Japanese Patent Application No. 2005-166609, 5 pages.

Decision of Refusal issued from JPO Nov. 9, 2010 with Partial English Translation.

* cited by examiner

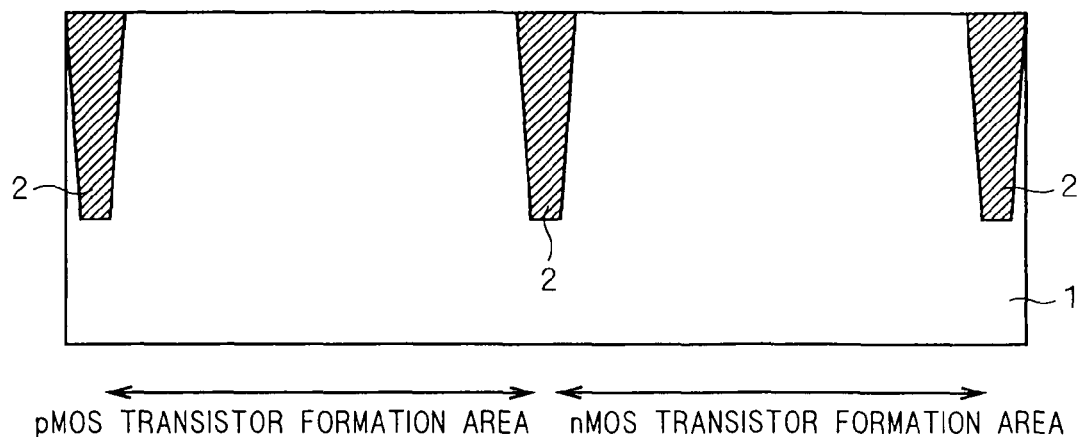
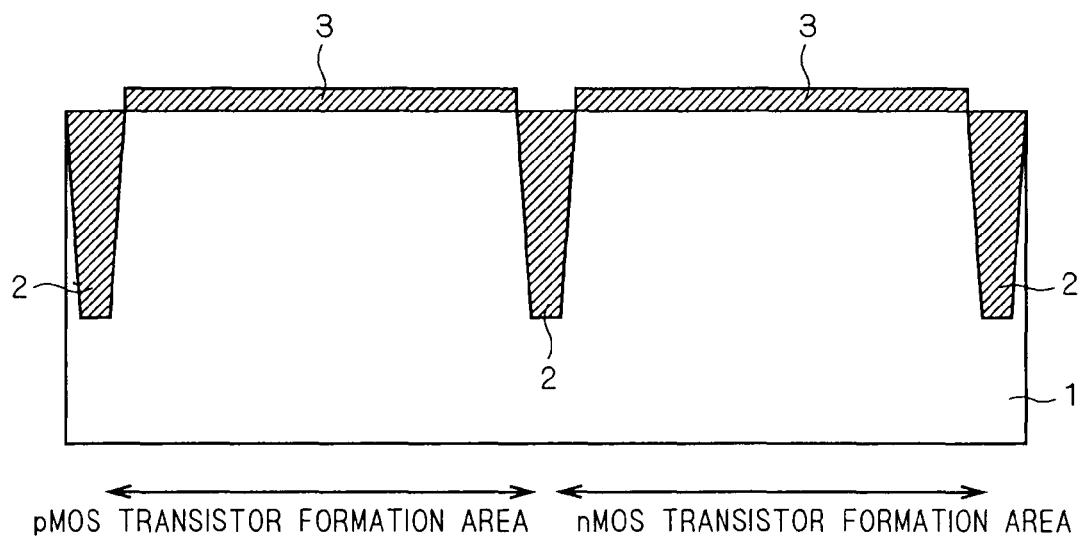

pMOS TRANSISTOR FORMATION AREA   nMOS TRANSISTOR FORMATION AREA pMOS TRANSISTOR FORMATION AREA   nMOS TRANSISTOR FORMATION AREA

F I G. 7
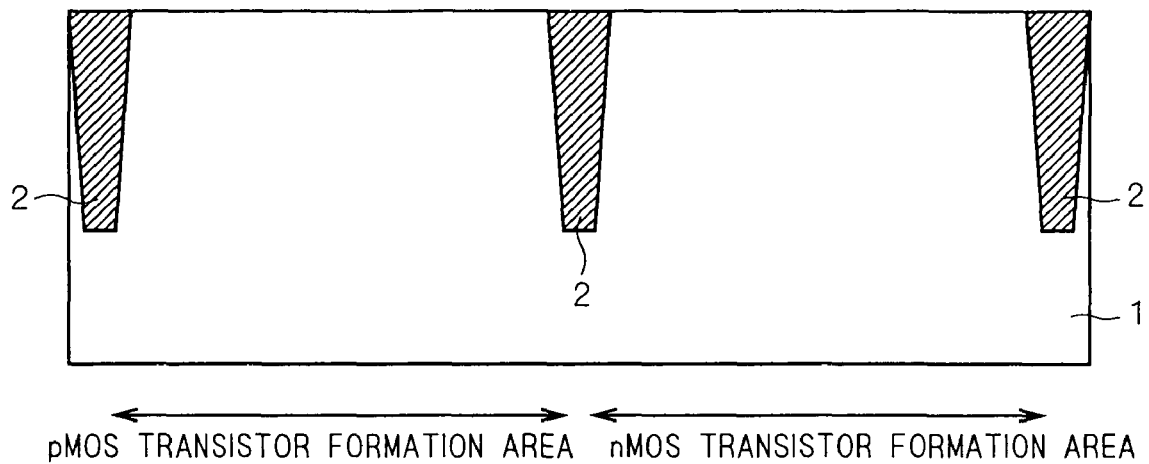
pMOS TRANSISTOR FORMATION AREA  nMOS TRANSISTOR FORMATION AREA
F I G. 8
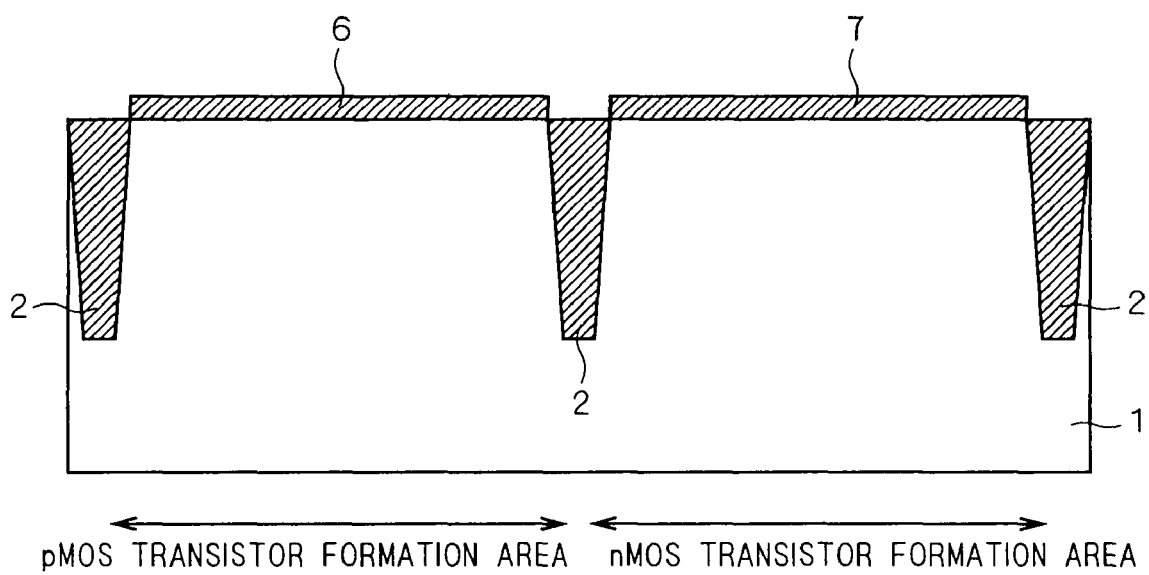
pMOS TRANSISTOR FORMATION AREA  nMOS TRANSISTOR FORMATION AREA pMOS TRANSISTOR FORMATION AREA    nMOS TRANSISTOR FORMATION AREA pMOS TRANSISTOR FORMATION AREA    nMOS TRANSISTOR FORMATION AREA pMOS TRANSISTOR FORMATION AREA | nMOS TRANSISTOR FORMATION AREA

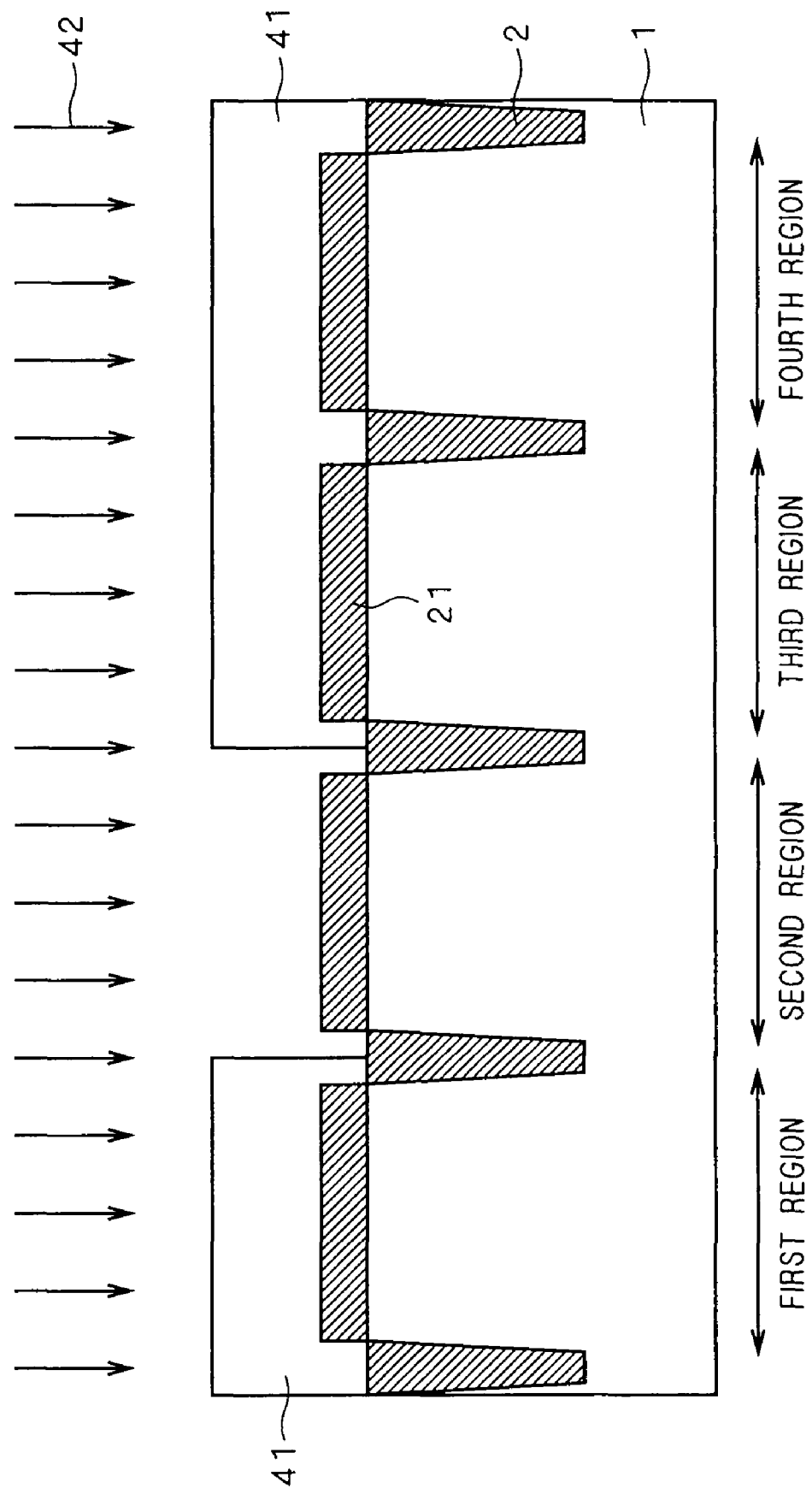

MANUFACTURING METHOD OF CMOS TYPE SEMICONDUCTOR DEVICE, AND CMOS TYPE SEMICONDUCTOR DEVICE

CROSS-REFERENCE TO RELATED APPLICATION

This application is a divisional of U.S. application Ser. No. 11/409,081, filed Apr. 24, 2006 and claims priority from Japanese patent application No. 2005-166609 filed on Jun. 7, 2005, the contents of which are hereby incorporated by reference into this application.

Field of the Invention

The present invention relates to a manufacturing method of a CMOS type semiconductor device, and a CMOS type semiconductor device, and particularly relates to a manufacturing method of a CMOS type semiconductor device, and a CMOS type semiconductor device with which nitrogen and halogen are included in a gate insulating film of a pMOS transistor.

Description of the Background Art

Nitrogen is now commonly introduced into a gate insulating film in a CMOS type semiconductor device. It is from the following reasons to introduce nitrogen into a gate insulating film in this way.

For example, it is assumed that a gate insulating film of the above-mentioned structure is formed on a semiconductor substrate of a pMOS transistor area, and a gate electrode is formed on the gate insulating film concerned. Here, boron is incorporated into the gate electrode.

In such structure, diffusion of boron from the gate electrode to the semiconductor substrate can be prevented by adopting the above-mentioned gate insulating film in which nitrogen was introduced. Further, the gate leakage current which flows through the gate insulating film can be suppressed by adopting the above-mentioned gate insulating film in which nitrogen was introduced.

Nitrogen is introduced into a gate insulating film of a CMOS transistor from the above reason.

However, when nitrogen concentration in a gate insulating film is made high (especially, when nitrogen concentration in a boundary of a semiconductor substrate and a gate insulating film is made high), the NBTI (Negative Bias Temperature Instability) lifetime in pMOS becomes short as pointed out in the nonpatent literature 1, etc.

In order to suppress lowering of the NBTI lifetime concerned, the technology which introduces fluorine into a gate insulating film of a pMOS transistor exists. As a prior art of the fluorine introduction concerned, Patent Reference 1 exists, for example.

In the technology concerning Patent Reference 1 concerned, a gate insulating film is formed on a semiconductor substrate, and nitrogen is introduced into the gate insulating film concerned. Then, a gate electrode is formed on the gate insulating film concerned. Then, a process of fluorine ion implantation is carried out to a semiconductor substrate on which the gate insulating film and the gate electrode concerned are formed.

Fluorine can be made to introduce into a gate insulating film by carrying out such steps. When the method concerning Patent Reference 1 is adopted, the concentration of fluorine becomes high mainly at the interface between a gate electrode and a gate insulating film.

[Nonpatent literature 1] N. Kimizuka, et al. Symposium on VLSI Technology Digest of Technical Papers 2000, pp 92

[Patent Reference 1] Japanese Unexamined Patent Publication No. 2001-291865

SUMMARY OF THE INVENTION

However, when boron was incorporated into a gate electrode of a pMOS transistor and the technology concerning above-mentioned Patent Reference 1 was applied, the following problem exists.

That is, in the above-mentioned case, the situation where boron and fluorine exist together occurs in a gate electrode. There is a problem that the boron penetration from a gate electrode to a silicon substrate is enhanced when such a situation occurs. The enhancement of the boron penetration concerned is reported in T. Aoyama, et al., Journal of applied physics, vol. 77, (1), 1995, and pp 417, for example.

And when the boron penetration is enhanced as mentioned above, a threshold voltage of a pMOS transistor may be changed and the standard deviation of the threshold voltage concerned may become larger. That is, the above-mentioned boron penetration to a semiconductor substrate has an adverse effect on the performance of a pMOS transistor.

Fluorine is implanted into the gate insulating film of the nMOS transistor etc. with the technology concerning Patent Reference 1. When fluorine is implanted also to the gate insulating film of an nMOS transistor like this, the problem that the performance of the nMOS transistor concerned deteriorates (that is, the driving current of an nMOS transistor falls) will occur.

Then, the present invention aims at offering a manufacturing method of a CMOS type semiconductor device and a CMOS type semiconductor device which can aim at improvement in the NBTI lifetime of a pMOS transistor, without degrading the performance of an nMOS transistor, and which can suppress the boron penetration to the semiconductor substrate concerned, when boron is contained in the gate electrode of the pMOS transistor.

In order to attain the above-mentioned purpose, a manufacturing method of a CMOS type semiconductor device, in one example, comprises the steps of; (a) preparing a semiconductor substrate which has pMOS transistor areas and nMOS transistor formation areas; (b) forming an insulating film over the semiconductor substrate; (c) after step (b), introducing halogen to the semiconductor substrate of all or partial areas of the pMOS transistor formation area; (d) after step (c), removing the insulating film; (e) after step (d), forming a first gate insulating film over the semiconductor substrate of the pMOS transistor formation area after the step (d); (f) after step (e), introducing nitrogen to the first gate insulating film; (g) after step (f), forming a first gate electrode over the first gate insulating film; and (h) after step (g), incorporating boron into the first gate electrode.

Since the manufacturing method of a CMOS type semiconductor device, in one example, comprises the steps of; (a) preparing a semiconductor substrate which has pMOS transistor formation areas and nMOS transistor formation areas; (b) forming an insulating film over the semiconductor substrate; (c) after step (b), introducing halogen to the semiconductor substrate of all or partial areas of the pMOS transistor formation area; (d) after step (c), removing the insulating film; (e) after step (d), forming a first gate insulating film over the semiconductor substrate of the pMOS transistor formation area after the step (d); (f) after step (e), introducing nitrogen to the first gate insulating film; (g) after step (f), forming a first gate electrode over the first gate insulating film; and (h) after step (g), incorporating boron into the first gate electrode, it can be suppressed that halogen is contained in the gate electrode concerned. Therefore, diffusion of B (boron) from the gate electrode concerned to the semiconductor substrate can be suppressed. At the same time, the interface of the semiconductor substrate and the first gate insulating film is stabilized by the existence of halogen. Therefore, while the NBTI lifetime of the pMOS transistor improves, improvement in drain current can be aimed at.

BRIEF DESCRIPTION OF THE DRAWINGS

FIGS. 1 to 5 are sectional views for explaining the manufacturing method of the CMOS type semiconductor device concerning Embodiment 1;

FIGS. 7 and 8 are sectional views for explaining the manufacturing method of the CMOS type semiconductor device concerning Embodiment 1;

FIGS. 30 and 31 are sectional views for explaining the manufacturing method of, such as a CMOS type semiconductor device concerning Embodiment 4.

DETAILED DESCRIPTION OF THE PREFERRED EMBODIMENTS

Hereafter, this invention is concretely explained based on the drawings in which the embodiments are shown.

Embodiment 1

The manufacturing method of the CMOS type semiconductor device concerning this embodiment is concretely explained using process step sectional views.

First, as shown in FIG. 1, semiconductor substrate 1 which has a pMOS transistor formation area and an nMOS transistor formation area is prepared. Here, semiconductor substrate 1 is a p-type silicon substrate. Substrate of other types, such as n-type silicon or silicon on insulator (SOI) etc., can be used.

Next, as shown in FIG. 1, isolation 2 is formed in the surface of semiconductor substrate 1. A pMOS transistor formation area and an nMOS transistor formation area are electrically separated by the isolation 2 concerned. Here, the isolation 2 concerned can be formed by enforcing the shallow trench element isolation method, for example.

Next, n well (not shown) is formed to semiconductor substrate 1 of the pMOS transistor formation area. Further, p well (not shown) is formed to semiconductor substrate 1 of the nMOS transistor formation area. Here, each above-mentioned well can be formed by implementing the following methods.

For example, the resist which has openings at pMOS transistor formation areas is formed on semiconductor substrate 1 by employing the photo lithography technology. Then, the resist concerned is used as a mask and P (phosphorus) ions are driven in. Hereby, n well can be formed to semiconductor substrate 1 of pMOS transistor formation areas.

For example, the resist which has openings at nMOS transistor formation areas is formed on semiconductor substrate 1 by employing the photo lithography technology. Then, the resist concerned is used as a mask and $BF_2$ ions are driven in. Hereby, p well can be formed to semiconductor substrate 1 of nMOS transistor formation areas.

Next, As (arsenic) ions of desired quantity are driven in to semiconductor substrate 1 of pMOS transistor formation areas. Further, B (boron) ions of desired quantity are driven in to semiconductor substrate 1 of nMOS transistor formation areas. Then, the heat treatment of the temperature of about 850° C., and the time of about 10 seconds is performed in a nitrogen atmosphere to semiconductor substrate 1. Impurity ions can be activated by the heat treatment after the ion-implantation process concerned. The ion-implantation process and the heat treatment concerned are performed in order to adjust the threshold voltage of each transistor formed later.

Next, usual cleaning treatments, and the dissolution treatment using diluted fluoric acid are performed to semiconductor substrate 1. Hereby, the clean surface of semiconductor substrate 1 is exposed.

Next, a heat treatment is performed to the semiconductor substrate 1 concerned in an atmosphere containing oxygen. This step forms silicon oxide film 3 of predetermined thickness (for example, about 6 nm) on semiconductor substrate 1, as shown in FIG. 2.

Figure 3:
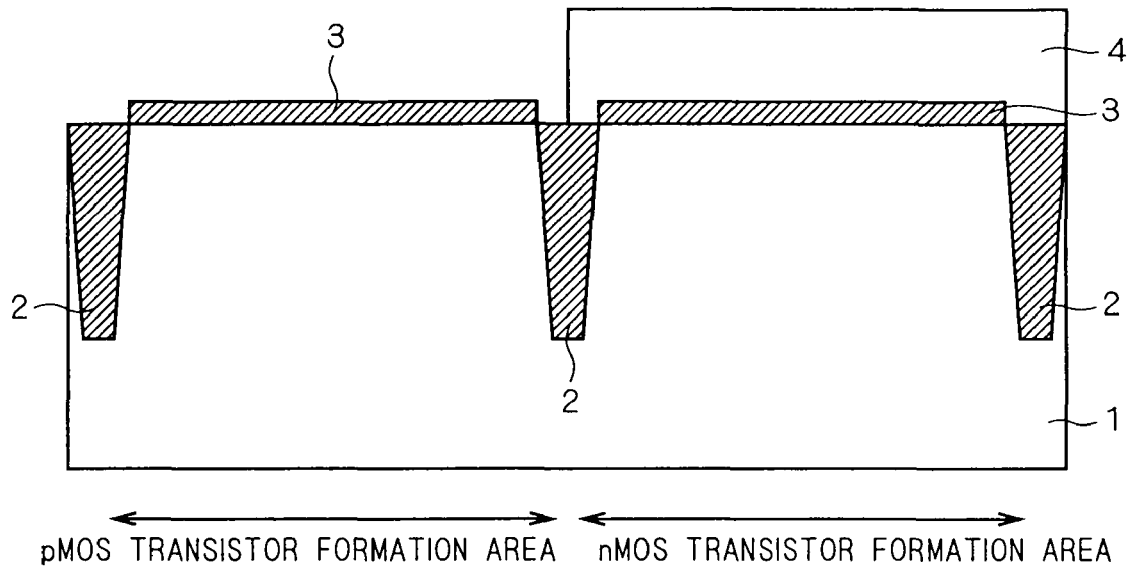

Next, resist 4 is applied to semiconductor substrate 1 so that silicon oxide film 3 is covered. And by giving the photo lithography technology, the resist 4 concerned is selectively removed so that a pMOS transistor formation area may have an opening. The state after removing the resist 4 concerned selectively is shown in FIG. 3. As shown in FIG. 3, the silicon oxide 3, etc. formed in the pMOS formation area is exposed.

Figure 4:
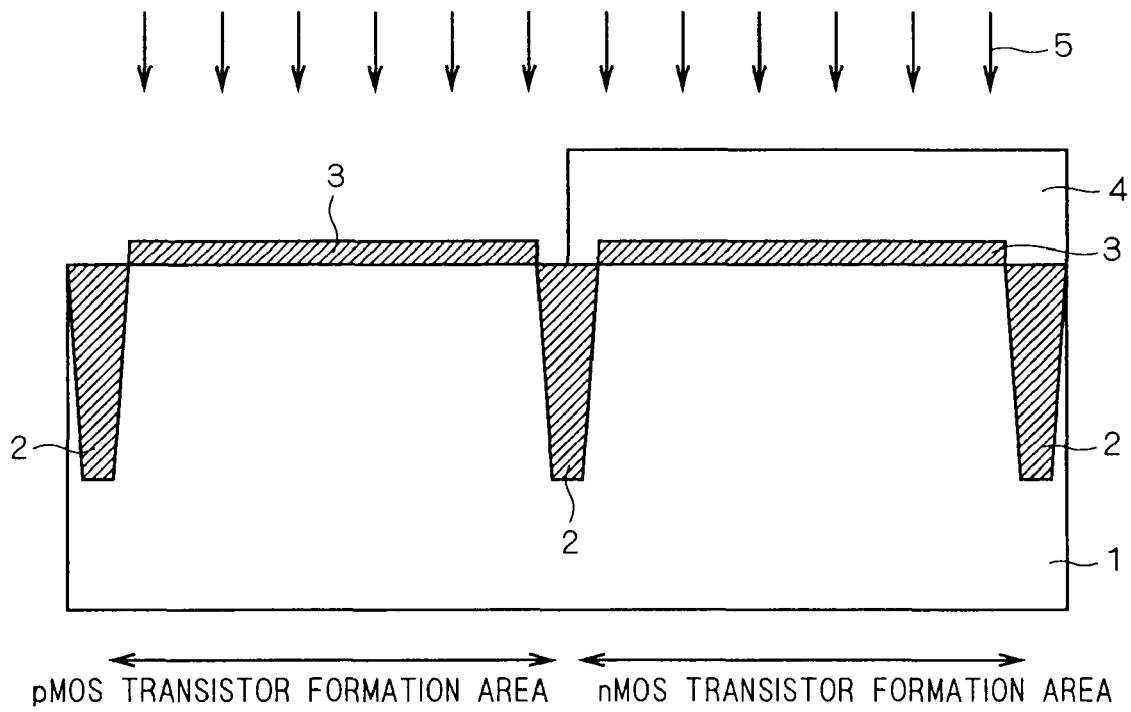

Next, as shown in FIG. 4, the above-mentioned resist 4 is used as a mask, and halogens ions 5, such as fluorine, are introduced to semiconductor substrate 1 of the pMOS transistor formation area. The implantation of the halogen ions 5 concerned can be performed under the conditions that the dosage of fluorine ion is about $4\times10^{14}/cm^2$, and the ion acceleration voltage is about 12 kV, for example.

The nMOS transistor formation area is masked by resist 4 when introducing the halogen ions 5 concerned. Therefore, halogen ions 5 are not introduced into the nMOS transistor formation area concerned.

In the above, reference was made about the case where a fluorine ion-implantation process is performed, to semiconductor substrate 1. However, plasma treatments (it can be grasped as an active halogen process) using fluorine etc. may also be performed to semiconductor substrate 1 on which the above-mentioned mask is formed. In either case, halogens ions 5, such as fluorine, can be introduced near the surface of semiconductor substrate 1 of the pMOS transistor formation area by a more practical method.

Figure 5:
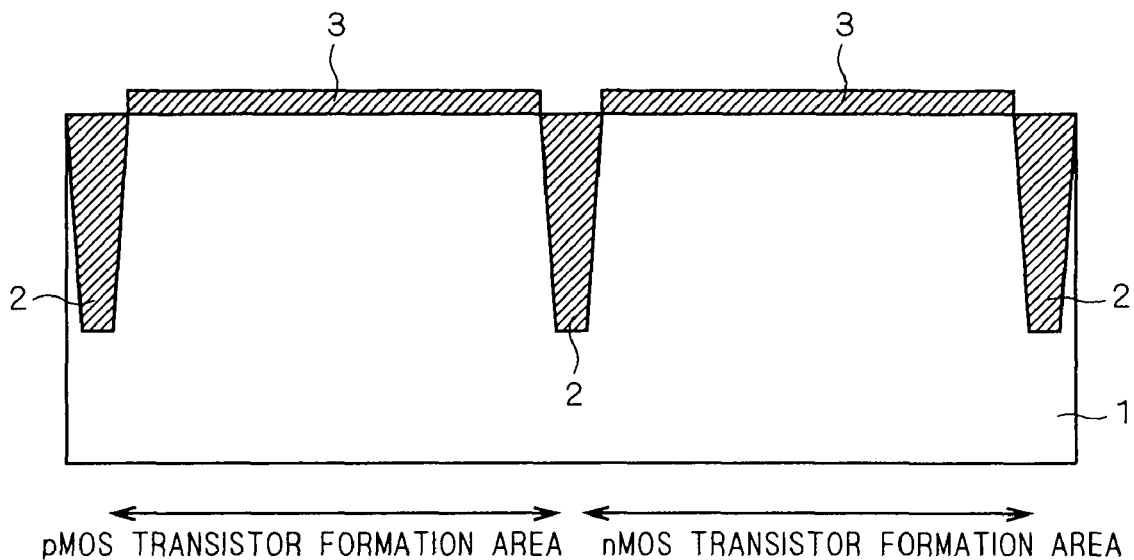

Next, resist 4 is removed as shown in FIG. 5. Then, a heat treatment is performed to the semiconductor substrate 1 concerned at the temperature of about 900° C. and for about 10 minutes in an nitrogen atmosphere. Hereby, the damage of semiconductor substrate 1 by the ion-implantation process can be recovered.

Here, the distribution of fluorine in semiconductor substrate and silicon oxide film 3 was investigated using the secondary ion mass spectroscopy (SIMS). The result of the measurement concerned is shown in FIG. 6.

The above-mentioned result shows the distribution of the fluorine included in semiconductor substrate 1 and silicon oxide film 3 in the pMOS transistor formation area. Here, the vertical axis is fluorine concentration (arbitrary unit a.u.), and the horizontal axis is depth (nm) from the surface of silicon oxide film 3.

Figure 6:
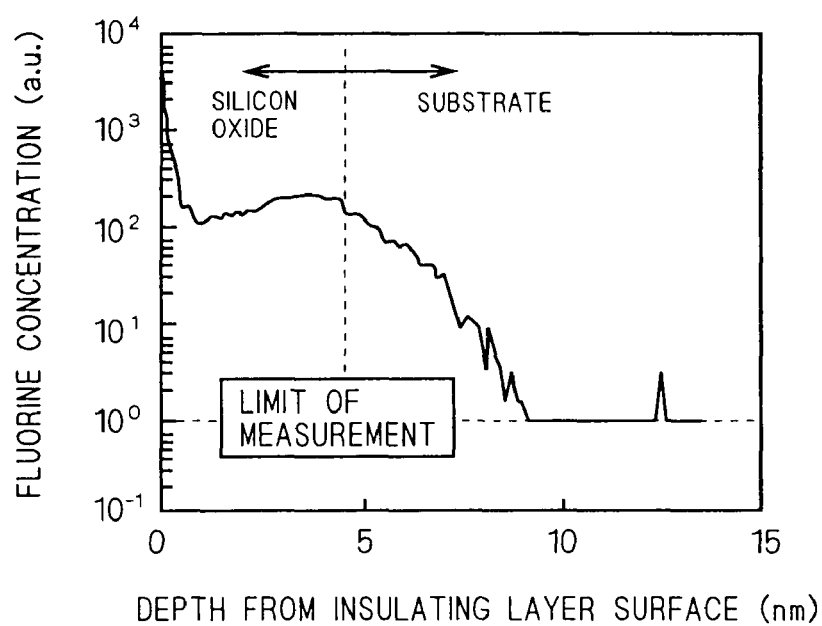
FIG. 6 is a drawing showing the result of a measurement of fluorine concentration in a semiconductor substrate and a silicon oxide film.

Fluorine is distributed over semiconductor substrate 1 from silicon oxide film 3 very broadly like FIG. 6 shows. In addition, it can be seen that fluorine tends to gather near the boundary of silicon oxide film 3 and semiconductor substrate 1. In near the surface of silicon oxide film 3, it seems that fluorine concentration is rising. However, this is an error of measurement as everyone knows, and differs from actual fluorine concentration.

Now, after recovering the damage of semiconductor substrate 1 according to the above-mentioned process step, dissolution treatment by diluted fluoric acid is performed to semiconductor substrate 1. Hereby, as shown in FIG. 7, silicon oxide film 3 is removed and the surface of semiconductor substrate 1 is exposed again.

Next, a heat treatment is performed by introducing semiconductor substrate 1 into an atmosphere containing oxygen. Hereby, as shown in FIG. 8, each gate insulating films 6 and 7 of the predetermined thickness which comprises a silicon oxide film are formed in the predetermined region on semiconductor substrate 1. Concretely, gate insulating film 6 is formed on semiconductor substrate 1 of the pMOS transistor formation area, and gate insulating film 7 is formed on semiconductor substrate 1 of the nMOS transistor formation area.

Halogen (fluorine) 5 is diffused from semiconductor substrate 1 to gate insulating film 6 during the step of forming gate insulating films 6 and 7. Formation of gate insulating films 6 and 7 may be performed simultaneously, or it may be carried out separately independently.

Next, to each gate insulating films 6 and 7, nitrogen is introduced by active nitrogen process such as radical nitridation or plasma nitridation etc.

Here, distribution of fluorine was measured by after the nitrogen incorporation to the above-mentioned gate insulating films 6 and 7. The result of a measurement concerned is shown in FIG. 9.

Figure 9:
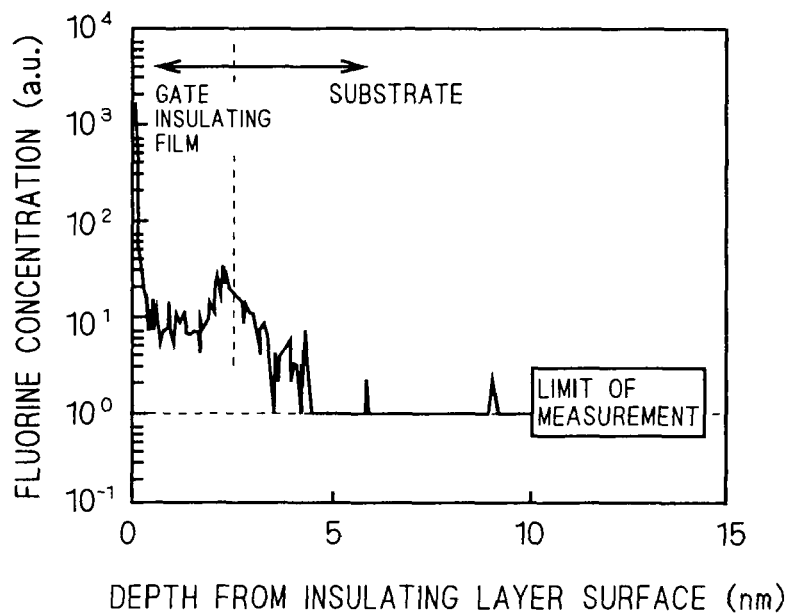
FIG. 9 is a drawing showing the result of a measurement of fluorine concentration in a semiconductor substrate and a gate insulating film.

FIG. 9 shows the distribution of the fluorine included in semiconductor substrate 1 and gate insulating film 6 in the pMOS transistor formation area. Here, the vertical axis is fluorine concentration (arbitrary unit a.u.). The horizontal axis is depth (nm) from the surface of gate insulating film 6.

As compared with the result of a measurement of FIG. 6, the concentration of fluorine is decreasing like FIG. 9 shows. It is thought that this is caused by that the fluorine in silicon oxide film 3 was removed simultaneously with removal of silicon oxide film 3, and it diffused outside during the subsequent oxidation treatment.

The tendency that fluorine concentrates near the boundary of gate insulating film 6 and semiconductor substrate 1 is seen in FIG. 9. Hereby, it is expected that fluorine terminates and deactivates the interface defects of gate insulating film 6 and semiconductor substrate 1.

In near the surface of gate insulating film 6, it seems that fluorine concentration is rising. However, this is an error of measurement as everyone knows, and differs from actual fluorine concentration.

Now, well-known chemical vapor deposition using mono silane as source gas is given to semiconductor substrate 1 after formation of each gate insulating films 6 and 7. Hereby, the polycrystalline silicon film of about 130 nm of thickness is deposited on semiconductor substrate 1.

Then, B ions are implanted to the polycrystalline silicon film of the pMOS transistor formation area. P ions are implanted to the polycrystalline silicon film of the nMOS transistor formation area. Here, the implantation of B ion can be performed under the conditions that the dosage is about $5\times10^5/cm^2$ and the acceleration voltage is about 2 kV. The implantation of P ion can be performed under the conditions that the dosage is about $5\times10^{15}/cm^2$ and the acceleration voltage is about 15 kV.

Figure 10:
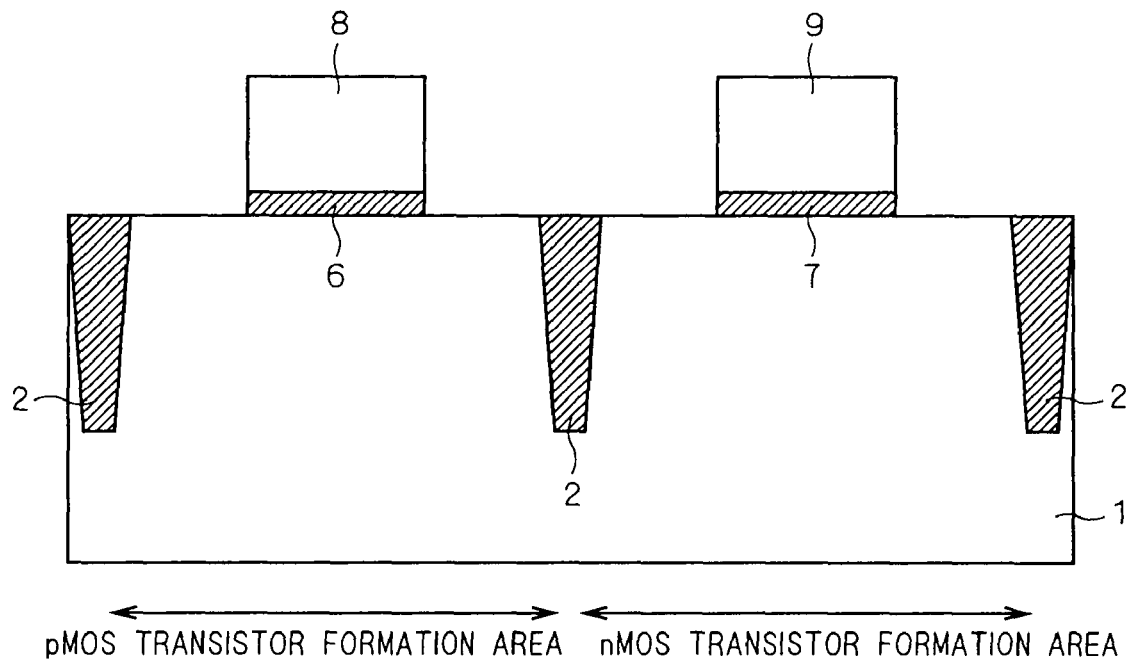
FIGS. 10 to 15 are sectional views for explaining the manufacturing method of the CMOS type semiconductor device concerning Embodiment 1.

Next, the polycrystalline silicon film is patterned using the photo lithography and dry etching. Hereby, as shown in FIG. 10, gate electrodes 8 and 9 can be respectively formed on each gate insulating film 6 and 7. Concretely, p+ type gate electrode 8 is formed on gate insulating film 6. n+ type gate electrode 9 is formed on gate insulating film 7.

Figure 11:
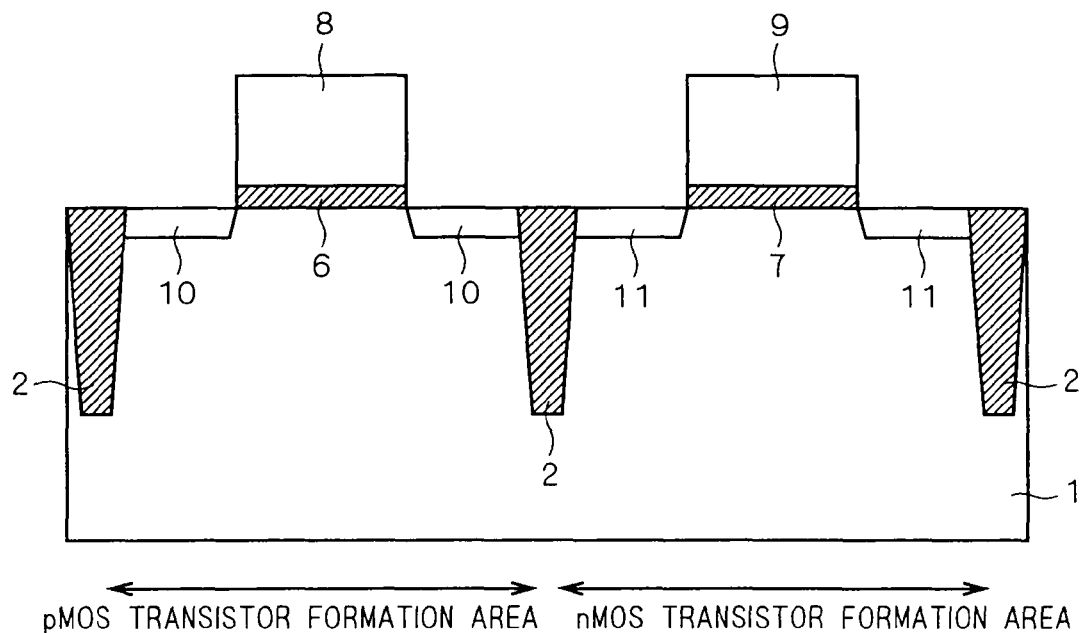

Next, B ions are implanted to semiconductor substrate 1 of both sides of gate electrode 8. As ions are implanted to semiconductor substrate 1 of both sides of gate electrode 9. Hereby, as shown in FIG. 11, p type low concentration impurity diffusion region 10 is formed in the surface of semiconductor substrate 1 of the pMOS transistor formation area, and n type low concentration impurity diffusion region 11 is formed in the surface of semiconductor substrate 1 of the nMOS transistor formation area.

Here, the implantation process of B ion can be performed under the conditions that the dosage is about $3\times10^{14}/cm^2$ and the acceleration voltage is about 1 kV, for example. The implantation process of As ion can be performed under the conditions that the dosage is about $3\times10^{14}/cm^2$ and the acceleration voltage is about 5 kV, for example.

Next, well-known chemical vapor deposition using mono silane and nitrous oxide as source gas is given. Hereby, the silicon oxide film of about 100 nm of thickness is deposited on semiconductor substrate 1.

Figure 12:
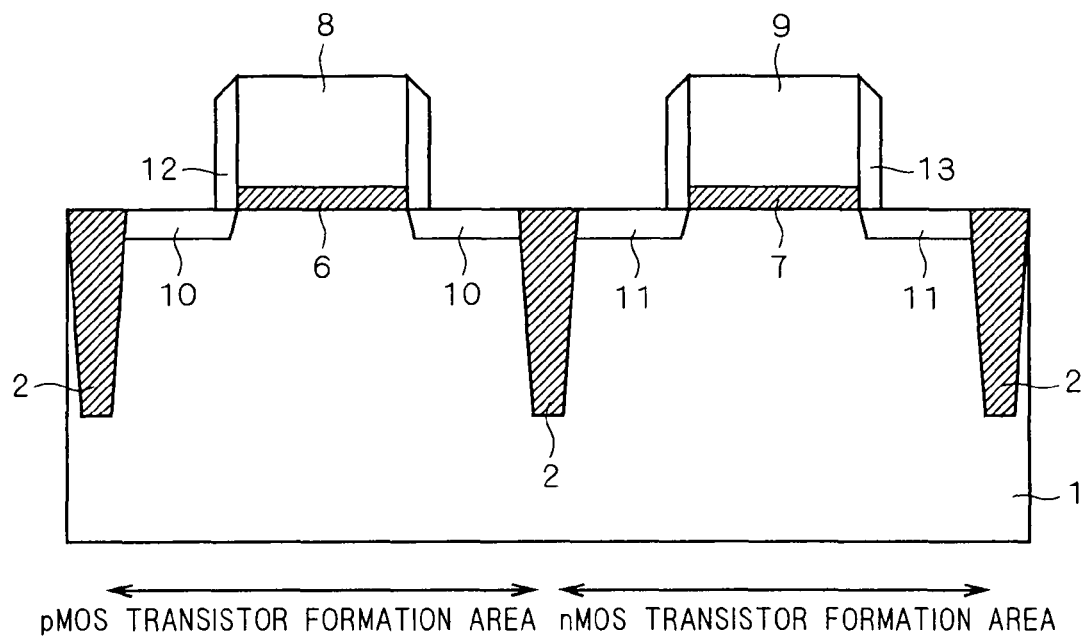

Next, an anisotropic dry etching process is performed to the silicon oxide film concerned. Hereby, as shown in FIG. 12, sidewalls 12 are formed on the both side surfaces of gate electrode 8, and sidewalls 13 are formed on the both side surfaces of gate electrode 9.

Figure 13:
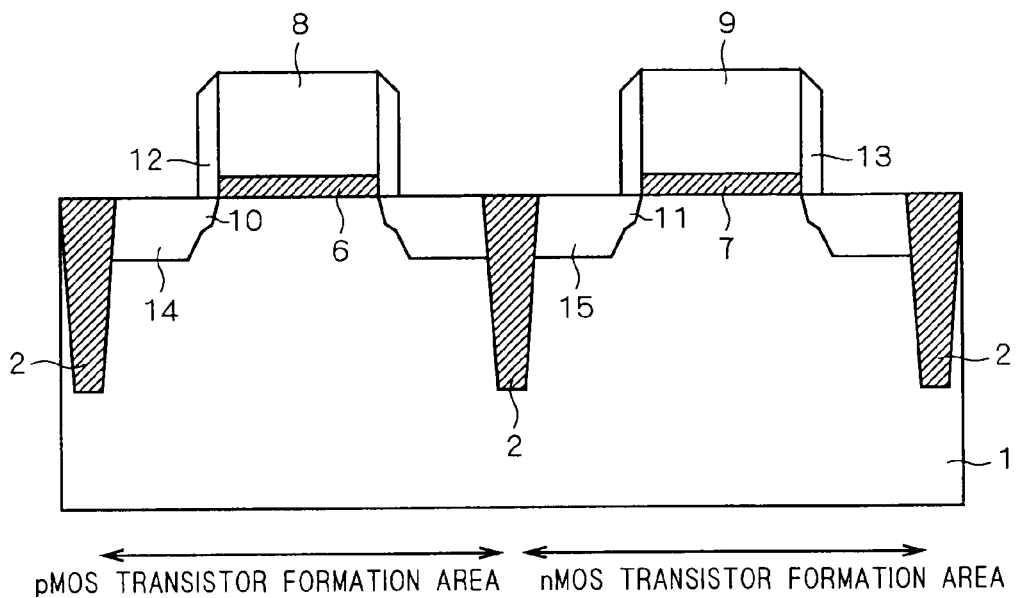

Next, B ions are implanted to semiconductor substrate 1 of both sides of gate electrode 8. As ions are implanted to semiconductor substrate 1 of both sides of gate electrode 9. Hereby, as shown in FIG. 13, p type high concentration impurity diffusion region 14 is formed in the surface of semiconductor substrate 1 of the pMOS transistor formation area, and n type high concentration impurity diffusion region 15 is formed in the surface of semiconductor substrate 1 of the nMOS transistor formation area.

Here, the implantation process of B ion can be performed under the conditions that the dosage is about $5\times10^{15}/cm^2$ and the acceleration voltage is about 3 kV, for example. The implantation process of As ion can be performed under the conditions that the dosage is about $5\times10^5/cm^2$ and the acceleration voltage is about 10 kV, for example.

Next, a heat treatment of a temperature of about 1025° C. and for about 10 seconds is performed to semiconductor substrate. Hereby, the above-mentioned low concentration impurity diffusion regions 10 and 11 and high concentration impurity diffusion regions 14 and 15 are electrically activated.

Figure 14:
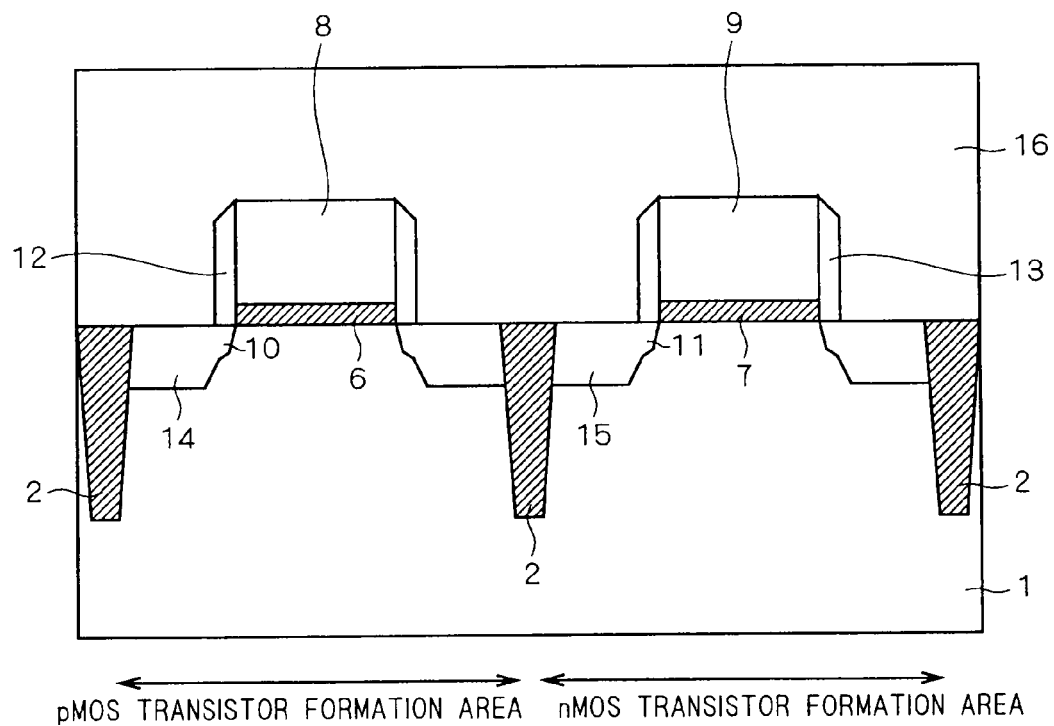

Next, chemical vapor deposition is given, using $Si(OC_2H_5)_4$ (tetra-ethoxy silane) as source gas. Hereby, a silicon oxide film of about 600 nm of thickness is deposited on semiconductor substrate 1 so that gate electrodes 8 and 9 are be covered. Then, to the upper surface of the silicon oxide film concerned, a CMP (Chemical Mechanical Polishing) process is performed and the upper surface of the silicon oxide film is flattened. Thus, as shown in FIG. 14, interlayer insulation film 16 is formed on semiconductor substrate 1.

Next, contact holes 16a are formed using the photolithography and dry etching. Then, tungsten film is formed using a chemical vapor deposition so that it fills up in contact hole 16a. Further, photo lithography and dry etching are carried out. Hereby, as shown in FIG. 15, via plug 17 is formed in interlayer insulation film 16, and wiring 18 connected to the via plug 17 concerned is formed on interlayer insulation film 16.

Figure 15:
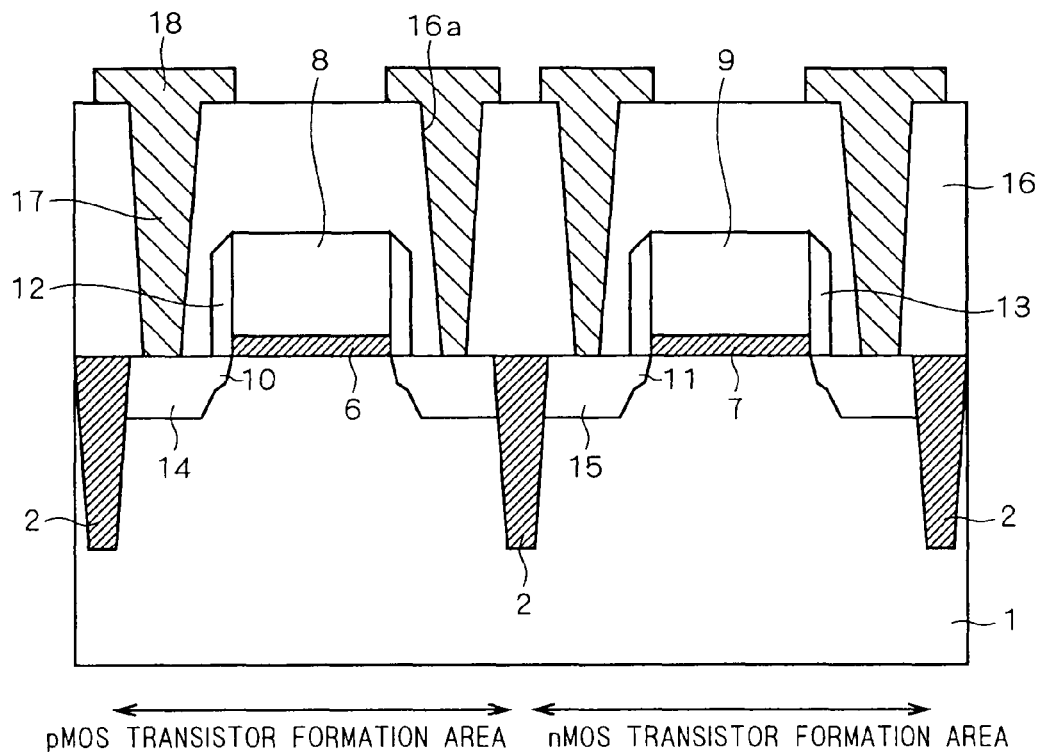

According to the process steps to the above, the CMOS type semiconductor device concerning this embodiment can be completed (FIG. 15).

Although omitted above, in the manufacturing method of an actual CMOS type semiconductor device, process steps, such as formation of sidewalls of a more complicated structure, a self-aligned silicidation, and copper multilayer interconnection formation, are given.

As mentioned above, in the CMOS type semiconductor device concerning this embodiment, to semiconductor substrate 1 of a pMOS transistor formation area, halogen 5 is introduced and gate insulating film 6 is formed on semiconductor substrate 1 of the pMOS transistor formation area after that.

Therefore, even if gate electrode 8 containing boron is formed on gate insulating film 6 as mentioned above, halogen 5 does not substantially diffuse into gate electrode 8. Therefore, the situation that halogen 5 and boron exist together in gate electrode 8 can be prevented. By the above, acceleration of the boron penetration to semiconductor substrate 1 from gate electrode 8 can be suppressed. That is, the deviation of the threshold voltage of pMOS transistors can be suppressed.

Suppose that the manufacturing method of the CMOS type semiconductor device concerning this above-mentioned embodiment was adopted. That is, suppose that halogen 5 is introduced to semiconductor substrate 1 of the pMOS transistor formation areas, and after that gate insulating film 6 was formed on semiconductor substrate 1 of the pMOS transistor formation areas.

In such a case, the CMOS type semiconductor device manufactured has features shown below like the result of a measurement of FIG. 9 also shows.

That is, in a pMOS transistor, the concentration of halogen 5 near the boundary of semiconductor substrate 1 and gate insulating film 6 becomes high rather than the concentration of halogen 5 near the boundary of gate insulating film 6 and gate electrode 8.

In the manufacturing method of a CMOS type semiconductor device concerning this embodiment, halogen 5 is introduced to semiconductor substrate 1 of a pMOS transistor formation area, gate insulating film 6 is formed on semiconductor substrate 1 of the pMOS transistor formation area, and nitrogen is introduced to the gate insulating film 6 concerned after that. That is, after introducing halogen 5 to gate insulating film 6, nitrogen is introduced to the gate insulating film 6 concerned.

Therefore, the interface of semiconductor substrate 1 and gate insulating film 6 can be stabilized more (that is, it can be suppressed that nitrogen exists near the interface concerned). This is because halogen 5 whose desorption is harder than hydrogen etc., for example exists in the interface concerned intensively and the halogen 5 concerned is making the termination of the defect of the interface concerned like FIG. 9 etc. shows.

Thus, in the manufacturing method concerning this embodiment, since the interface of semiconductor substrate 1 and gate insulating film 6 is more stable, improvement in the NBTI lifetime of a pMOS transistor and improvement in an initial characteristic (improvement in drain current) can be expected.

Figure 16:
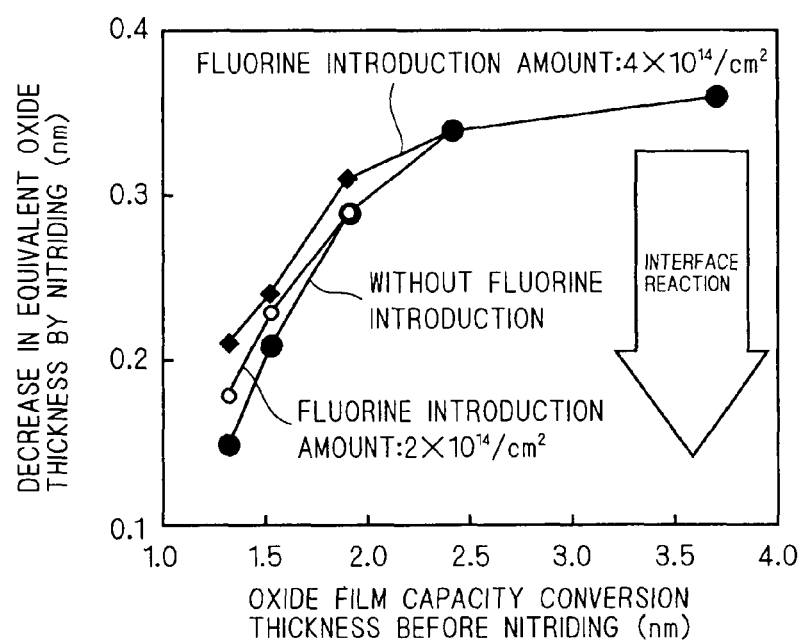
FIG. 16 is a result-of-a-measurement figure showing that fluorine introduction contributes to stabilization of the interface of a semiconductor substrate and a gate insulating film.

It is clear that the introduction of halogen 5 to the gate insulating film 6 concerned before the nitrogen introduction to gate insulating film 6 contributes to the stability of the interface of semiconductor substrate 1 and gate insulating film 6 also from the FIG. 16 which shows a qualitative result.

Figure 17:
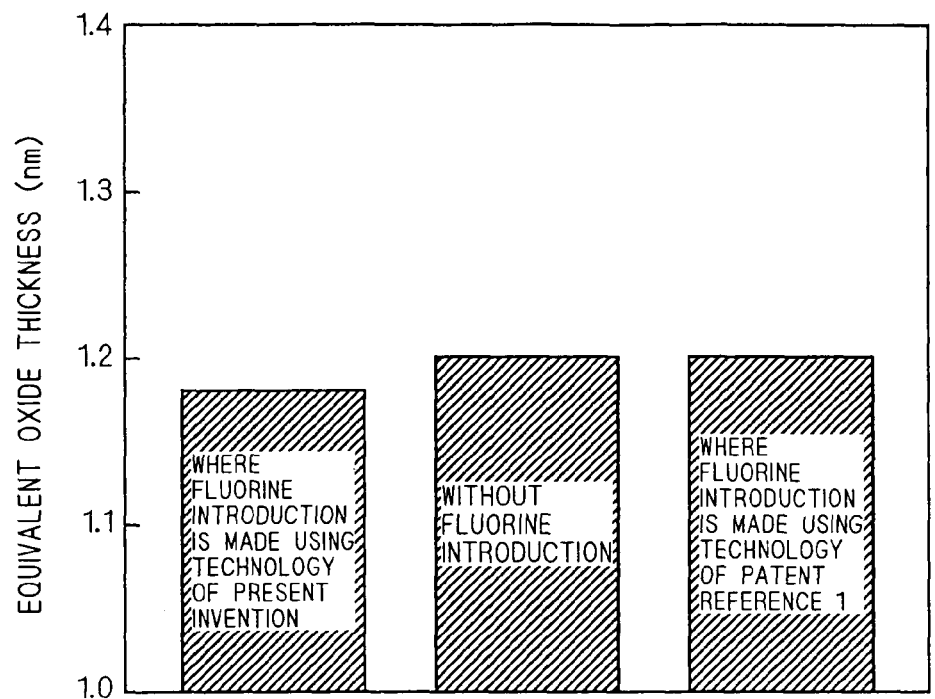
FIG. 17 is a drawing showing the result of a measurement of equivalent oxide thickness.
Figure 18:
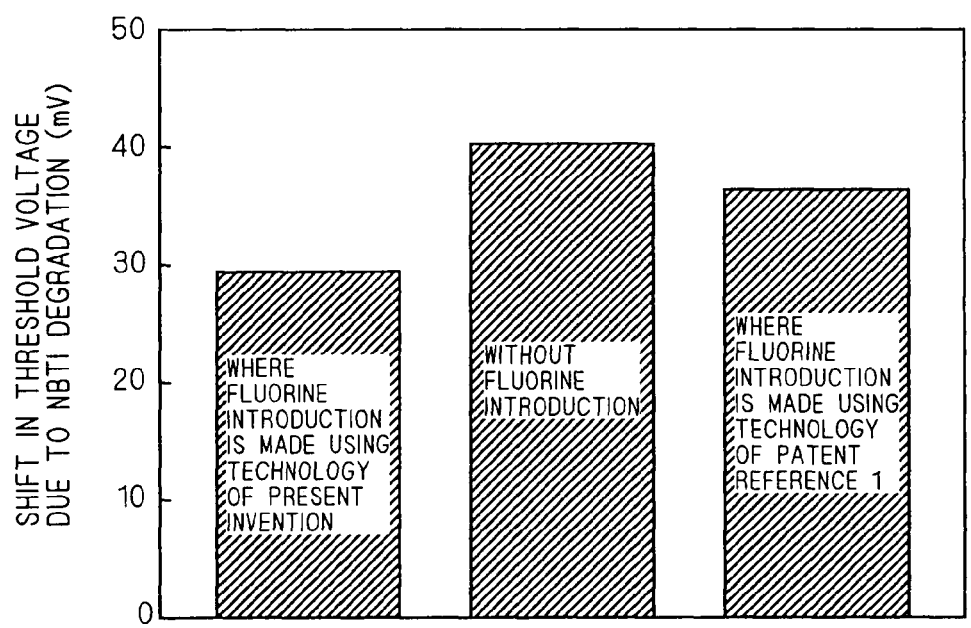
FIG. 18 is a drawing showing the result of a measurement regarding NBTI lifetime.
Figure 19:
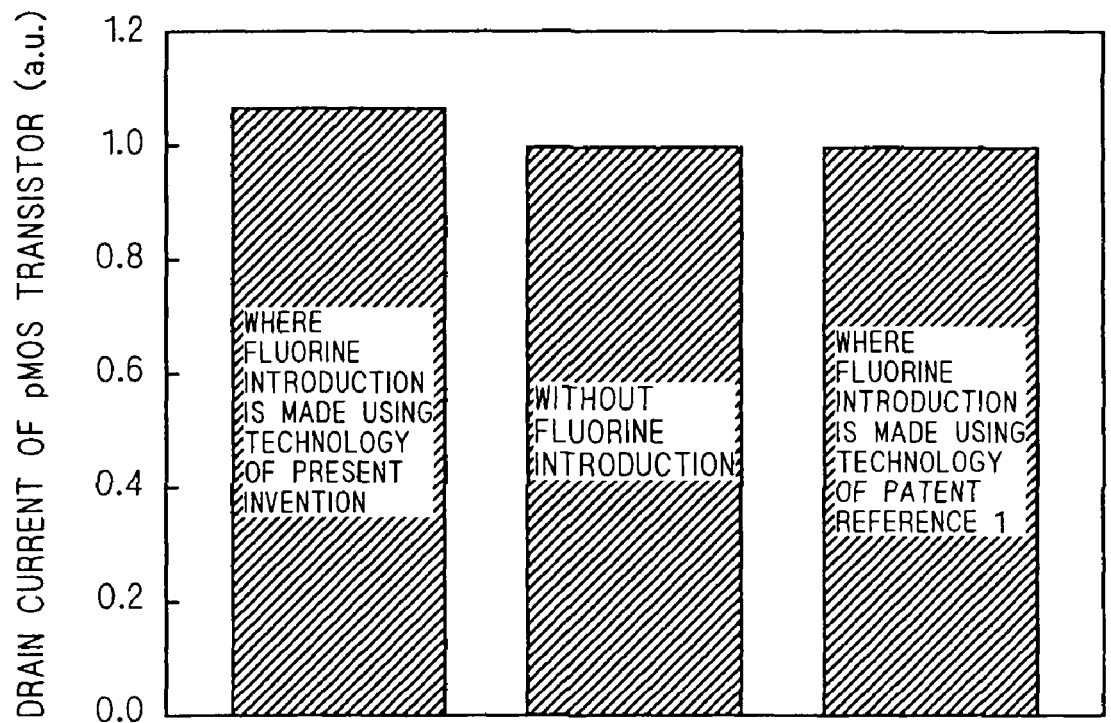
FIG. 19 is a drawing showing the result of a measurement of the drain current of a pMOS transistor.

It is distinct from FIGS. 17, 18 and 19 that the interface of semiconductor substrate 1 and gate insulating film 6 is more stable, that the NBTI lifetime of a pMOS transistor is improving and that the initial characteristic of a pMOS transistor is improving (improvement in drain current) by adopting the manufacturing method concerning this embodiment.

Here, in FIG. 16, the horizontal axis shows the equivalent oxide thickness (nm) before an active nitrogen process performs nitrogen introduction to gate insulating film 6. The vertical axis shows the decrement (nm) of equivalent oxide thickness by the nitrogen introduction to gate insulating film 6.

Generally, when an active nitrogen process is performed to a silicon oxide film, the equivalent oxide thickness decreases. This is considered to be because the oxygen near the surface is replaced by nitrogen, it is converted into the matter similar to silicon nitride, and the dielectric constant rises in connection with this. The decrement of the equivalent oxide thickness concerned is constant when the thickness of the silicon oxide film nitrided is to some extent thick. But, when it is made thin to 3 nm or less, the decrement of the equivalent oxide thickness due to the nitrogen incorporation becomes less pronounced. It is understood that this is the effect that a certain interface reaction comes to occur and the physical thickness increases during the active nitrogen process (C. -H. Chen et al., Electronics letters, vol. 37, no. 22, pp. 1367, 2001).

Therefore, in FIG. 16, it is shown that there are few interface reactions of semiconductor substrate 1 and gate insulating film 6 as an inclination is small. In analyses of an inventor, it turns out that this interface reaction has an adverse effect on the driving current of a transistor.

Equivalent oxide thickness is the thickness of a silicon oxide layer in the case of the ability to induce the electron etc. of the same density as the density of an electron or an electron hole induced in another dielectric-constant film. Measurement (derivation) of equivalent oxide thickness adopted the method currently disclosed by pp 348 of S. Saito et al., IEEE Electron Device Letters Vol. 23 (2002).

The thickness of the gate insulating film in a CMOS type semiconductor device is continuing decreasing with an advance of technology, and the thickness of the gate insulating film is about 1.5 nm or less than this in the latest present product.

Therefore, its attention is paid to the data near 1.5 nm in the horizontal axis of FIG. 16. Then, it turns out that the inclination of data will be small when introduction of the fluorine to gate insulating film 6 is increased, and the interface reaction generated by the active nitrogen process is inhibited.

Therefore, as the result of a measurement of FIG. 16 shows, it can be said that the introduction of halogen 5 to the gate insulating film 6 concerned before the nitrogen introduction to gate insulating film 6 has contributed to stabilization of the interface of semiconductor substrate 1 and gate insulating film 6.

FIG. 17 is the result of a measurement which compared the equivalent oxide thickness of gate insulating film 6 in the pMOS transistor at the time of applying the present invention with the equivalent oxide thickness of the gate insulating film in the pMOS transistor at the time of applying another technologies.

Here, another technologies are the technology which does not introduce the fluorine to a gate insulating film, and the technology which introduces the fluorine to the gate electrode concerned etc. after gate insulating film and gate electrode formation (technology concerning Patent Reference 1). In the technology concerning Patent Reference 1 concerned, ion-implantation of fluorine was performed under the conditions that the dosage was about $1 \times 10^{14}/cm^2$ and the acceleration voltage was about 10 kV.

When the inventors discussed, there was a side effect that B penetration from a gate electrode became remarkable when this method is used, and the magnitude of the side effect had positive correlation with a fluorine introduction amount to the gate electrode. Since the maximum fluorine introduction amount which can suppress B leakage to a tolerance level was $1 \times 10^{14}/cm^2$, the conditions concerned were used.

When fluorine is introduced using the manufacturing method concerning the present invention, the thinnest equivalent oxide thickness is obtained like FIG. 17 shows. This is considered to be the interface reaction suppression effect, as mentioned above.

FIG. 18 is the result of a measurement which compared the degree of NBTI degradation of the pMOS transistor at the time of applying the present invention with the degree of NBTI degradation of the pMOS transistor at the time of applying another technologies. Here, it can be said that the smaller the variation of the threshold voltage by NBTI degradation which is indicated by the vertical axis of FIG. 18, the longer the NBTI life is. The measurement concerned was carried out by giving the stress conditions for the time of 10,000 seconds with temperature 125° C., gate voltage-1.9 V, and grounding the source/drain/n well.

The pMOS transistor manufactured using the manufacturing method concerning the present invention has NBTI life longer than the pMOS transistor manufactured using another technology like FIG. 18 shows.

Concretely speaking, when the amount of degradation when not introducing fluorine was set to 100, the amount of degradation was about 75 when the present invention was applied. The amount of degradation at the time of applying the conventional technology which introduces fluorine was about 90. Progress of degradation can be suppressed by applying the present invention as the comparison concerned shows. That is, NBTI life can be improved by applying the present invention (when the amount of suppression effects of the above-mentioned degradation progress is converted into the amount of NBTI life, as compared with the case where another technology is applied, the NBTI life at the time of applying the present invention becomes long about 3 times).

Therefore, when the manufacturing method concerning this embodiment is used, it can be said that the NBTI life of the pMOS transistor is improving from the case where fluorine is not introduced. When fluorine is introduced by conventional technology, there is an effect which prolongs NBTI life, but the effect of the technology of the present invention is more remarkable.

It is thought that the increase in the introduction amount of fluorine causes that the high NBTI life extension effect was acquired by the technology of the present invention in this way. However, the suppression effect of the interface reaction between semiconductor substrate 1 and gate insulating film 6 may also originate.

FIG. 19 is the result of a measurement which compared the drain current value of the pMOS transistor at the time of applying the present invention with the drain current value of the pMOS transistor at the time of applying another technologies. The measurement concerned was carried out by applying gate voltage-1V and drain voltage-1V to the pMOS transistor of gate length 0.6 µm and gate width 10 µm.

The threshold voltage of a pMOS transistor is shifted by about 60 mV to the positive direction by application of the present invention compared with the conventional technology which does not introduce fluorine. When the conventional technology which introduces fluorine is applied, the threshold voltage of a MOS transistor is shifted by about 15 mV to the positive direction compared with the conventional technology which does not introduce fluorine. Each of these shifts originates in the fluorine introduction. Here, in each pMOS transistor made into a measuring object, threshold voltage is adjusted by adjustment of the impurity concentration in the substrate.

The pMOS transistor manufactured using the manufacturing method concerning the present invention has a drain current value larger than the pMOS transistor manufactured using another technology by about 7% like FIG. 19 shows. Only the effect that the equivalent oxide thickness of gate insulating film 6 became thin by introducing fluorine cannot explain the increase in the drain current value concerned. Therefore, it is thought as mentioned above that suppression of the interface reaction during the active nitrogen process has also contributed.

Therefore, it can be said that the initial characteristic of a pMOS transistor can be improved when the manufacturing method concerning this embodiment is used.

Also to the nMOS transistor formation area, inventors tried to incorporate halogen 5 and investigated (measured) the effect of the halogen 5 concerned in the formed nMOS transistor. The measurement concerned was performed by applying gate voltage 1V and drain voltage 1V to the nMOS transistor of gate length 0.6 µm and gate width 10 µm. Here, in order to adjust threshold voltage to an appropriate value, the implantation amount of the impurity to the semiconductor substrate of the nMOS transistor is adjusted.

As a result, it turned out that drain current of nMOS transistors fall when halogen 5 is introduced to semiconductor substrate 1 of the nMOS transistor formation area. When saying concretely, as a result of measuring under the above-mentioned conditions, drain current fell about 3% by introducing fluorine into semiconductor substrate 1 of the nMOS transistor formation area.

By the above, implantation of halogen 5 is omitted to semiconductor substrate 1 of the nMOS transistor formation area by the manufacturing method concerning this embodiment. Therefore, the lowering of drain current for nMOS transistors can be prevented.

Otherwise, introduction of chlorine ions etc. was tried as introduction of halogen 5 (the acceleration voltage of 25 kV, introduction amount of about $2 \times 10^{14}/cm^2$). In the case concerned, the effect that NBTI life improved with the above leakage of B (boron) in a pMOS transistor suppressed was acquired. However, the effect concerned was lower than the case where fluorine is used as halogen 5.

That is, each above-mentioned effect can be demonstrated more by applying fluorine as halogen 5.

In the manufacturing method concerning this embodiment, the active nitrogen process is adopted as a method of introducing nitrogen to gate insulating film 6. As another methods, a heat treatment in the atmosphere which contains nitrous oxide, nitric oxide, ammonia gas, etc., for example is also considered. However, these methods are inferior in respect of the suppression effect of gate leakage current, or NBTI reliability.

In the manufacturing method concerning this embodiment, gate insulating film 6 of pMOS transistors and gate insulating film 7 of nMOS transistors are formed simultaneously. Therefore, simplification of a manufacturing process can be aimed at.

Embodiment 2

In Embodiment 1, reference was made about the case where only high-speed logic circuits are formed on a semiconductor substrate (that is, when forming the gate insulating film of one kind of thickness on a semiconductor substrate) for simplification of explanation.

However, generally as for the present leading edge semiconductor integrated circuit, two or more kinds of gate insulating films with which thickness differs are formed on a semiconductor substrate. For example, it is a case where it forms digital circuits which comprise high-speed logic circuits and input output circuits, a case where analog circuits are also formed besides digital circuits, etc.

In the above-mentioned exemplification, since high-speed operation is required, the gate insulating film of each MOS transistor of high-speed logic circuits is comparatively thin, and the thickness of the gate insulating film of the MOS transistors which forms the other circuits (input output circuit etc.) is comparatively thick.

Also in manufacturing the semiconductor integrated circuits that have two or more kinds of gate insulating films with which thickness differs, the present invention can be applied and this is explained in this embodiment.

Hereafter, the manufacturing method concerning this embodiment is concretely explained using process step sectional views. The following explanation explains as an example bearing in mind the manufacturing method of the digital type semiconductor device (semiconductor integrated circuit) in which high-speed logic circuits and input output circuits are formed on a semiconductor substrate.

In the following explanation, a pMOS transistor or an nMOS transistor which forms the high-speed logic circuit where high-speed operation is demanded is called a core pMOS transistor or a core nMOS transistor. The MOS transistor which forms an input output circuit is called an I/O pMOS transistor or an I/O nMOS transistor.

Figure 20:
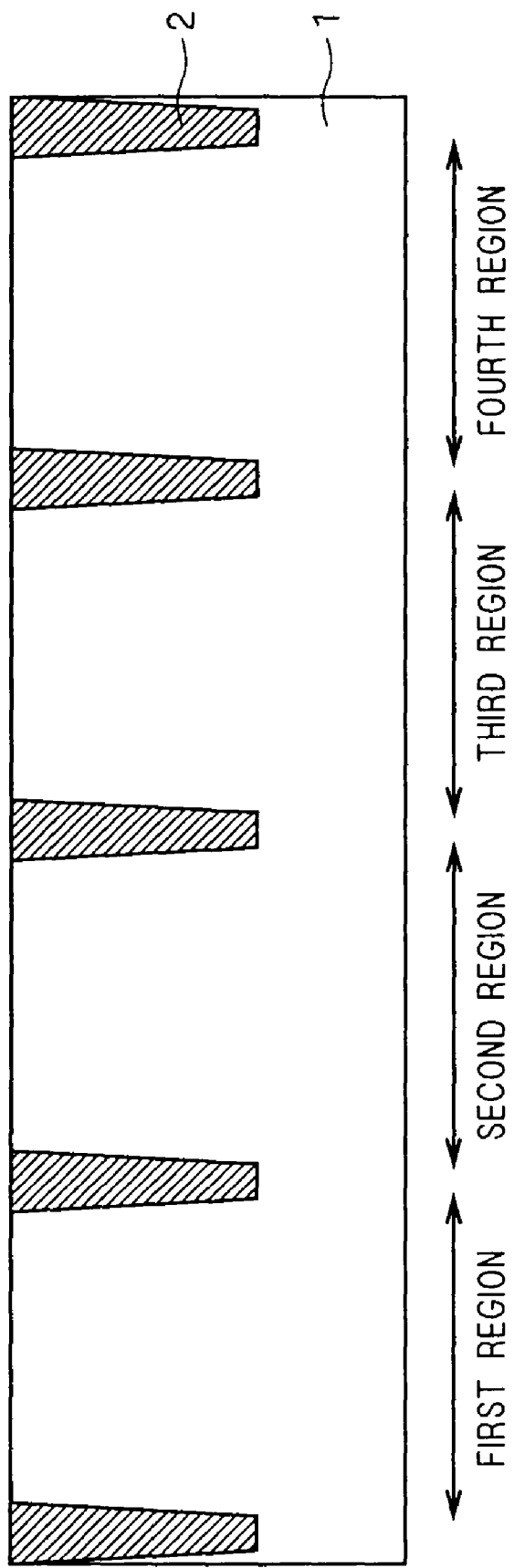
FIGS. 20 to 28 are sectional views for explaining the manufacturing method of, such as a CMOS type semiconductor device concerning Embodiment 2.

First, as shown in FIG. 20, semiconductor substrate 1 which has the first region, the second region, the third region, and the fourth region is prepared. And isolation 2 is formed in the surface of the semiconductor substrate 1 concerned like Embodiment 1. Each region (the first region through the fourth region) is electrically mutually separated by the isolation 2 concerned like FIG. 20 shows.

Here, a core pMOS transistor is formed in the first region. A core nMOS transistor is formed in the second region. An I/O pMOS transistor is formed in the third region. An I/O nMOS transistor is formed in the fourth region.

Next, predetermined ion-implantation process steps etc. are performed to the predetermined region of semiconductor substrate 1 like Embodiment 1 for formation of each well, adjustment of the threshold voltage of each transistor, etc.

Next, the usual cleaning treatments and the dissolution treatment using diluted fluoric acid are performed to the surface of semiconductor substrate 1. Hereby, the clean surface of semiconductor substrate 1 is exposed.

Figure 21:
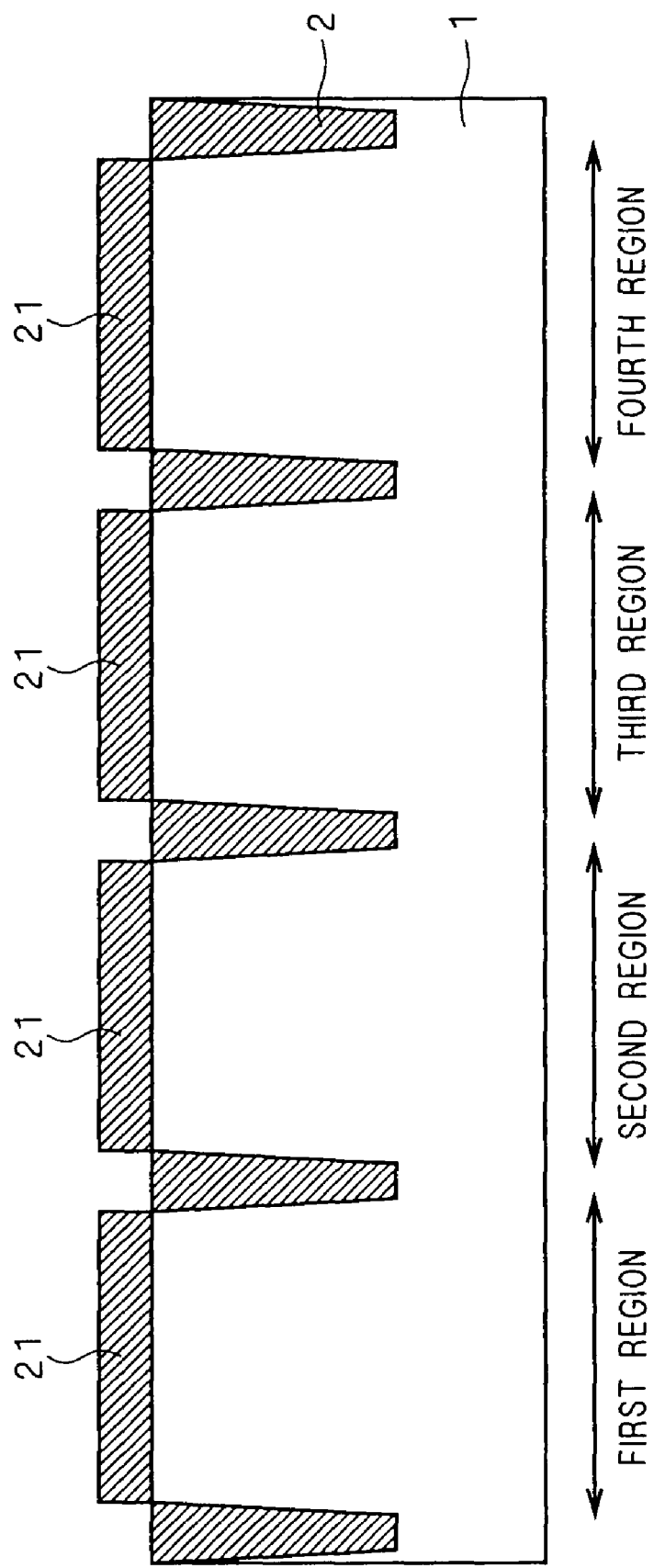

Next, a heat treatment is performed to the semiconductor substrate 1 concerned in an atmosphere containing oxygen. This step forms silicon oxide film 21 of a predetermined pattern and predetermined thickness (for example, it is about 6 nm-thick and it can be grasped that it is comparatively thick thickness) on semiconductor substrate 1, as shown in FIG. 21.

Figure 22:
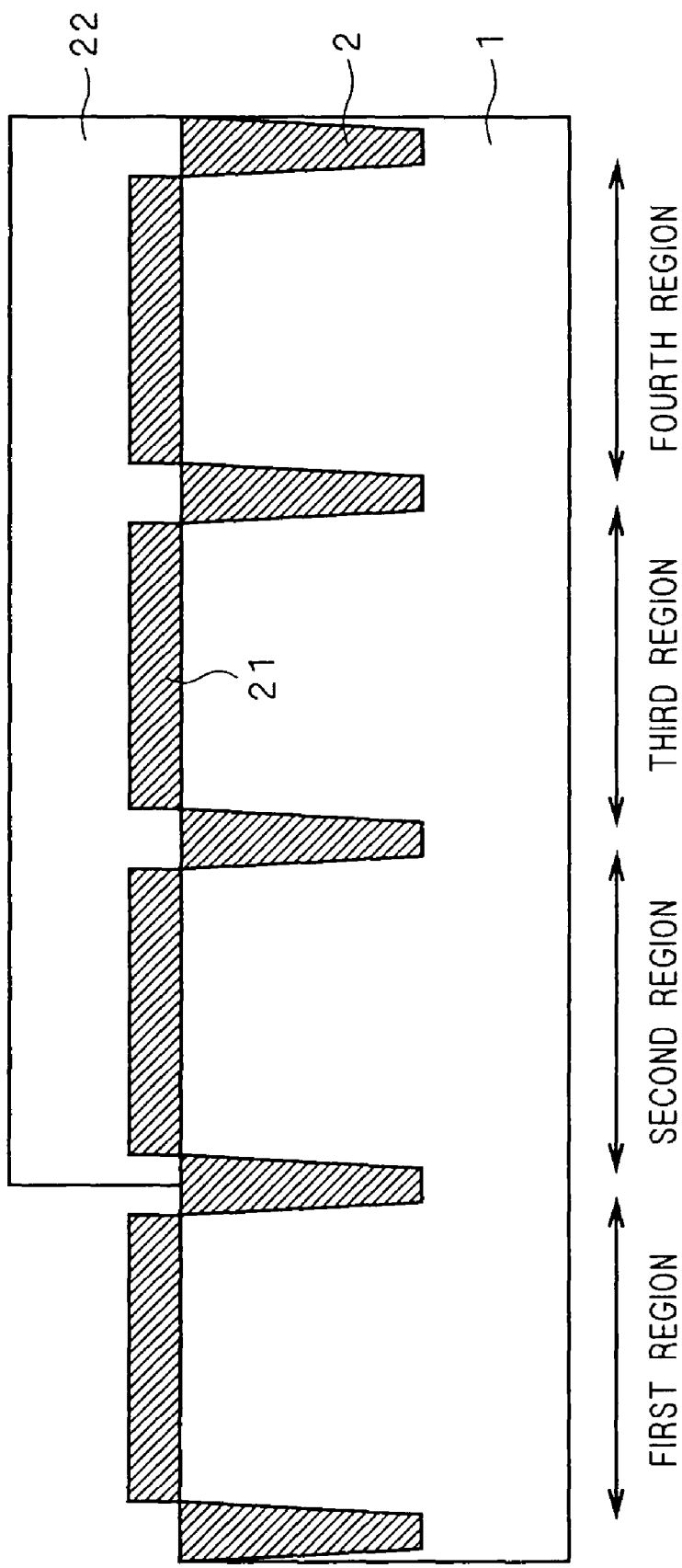

Next, resist 22 is applied to semiconductor substrate 1 so that silicon oxide film 21 is covered. And by giving the photo lithography technology, the resist 22 concerned is selectively removed so that the first region have an opening. The state after removing the resist 22 concerned selectively is shown in FIG. 22. As shown in FIG. 22, the silicon oxide film 21 etc. formed in the first region is exposed.

Figure 23:
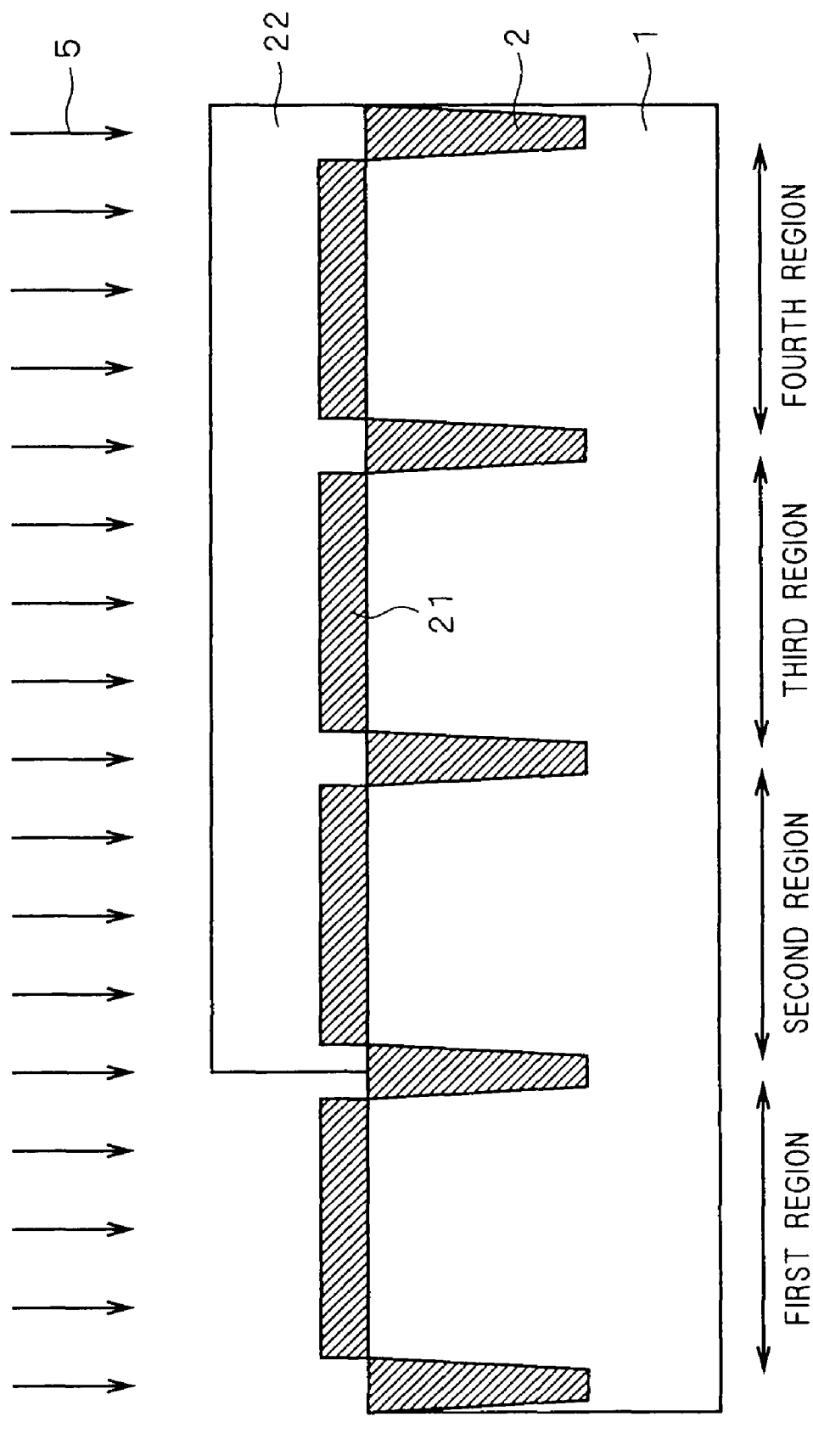

Next, as shown in FIG. 23, the above-mentioned resist 22 is used as a mask, and halogens ions 5, such as fluorine, are introduced to semiconductor substrate 1 of the first region. The implantation of the halogen ions 5 concerned can be performed under the conditions that the dosage of fluorine ion is about $4 \times 10^{14}/cm^2$ and the ion acceleration voltage is about 12 kV, for example.

The mask of the second region etc. is made by resist 22 at least when introducing the halogen 5 concerned (FIG. 23). Therefore, halogen 5 is not introduced into the second region at least.

Next, resist 22 is removed. Then, a heat treatment is performed at the temperature of about 900° C. and for about 10 minutes. Hereby, the damage of semiconductor substrate 1 by the ion-implantation process can be recovered.

Figure 24:
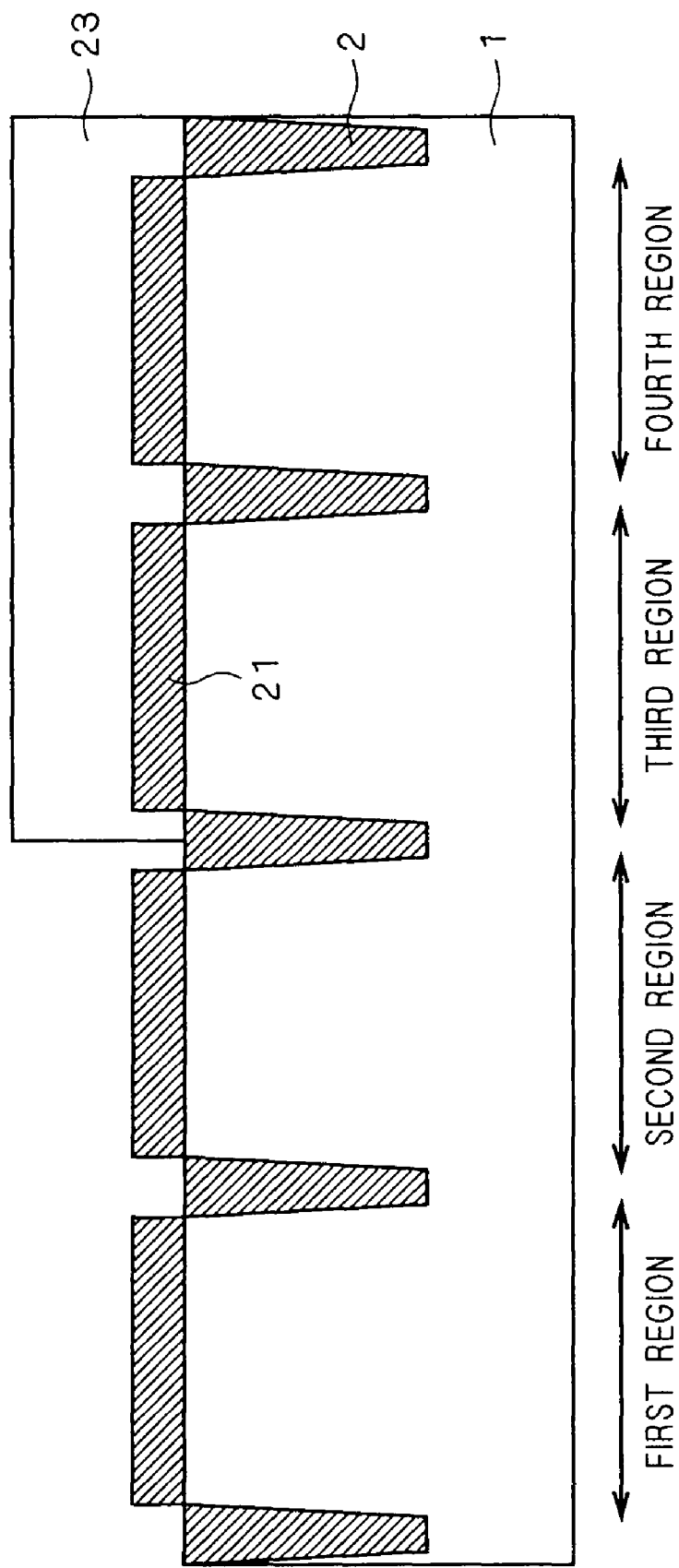

Again, resist 23 is applied to semiconductor substrate 1 here so that silicon oxide film 21 is covered. And by the photo lithography technology, the resist 23 concerned is selectively removed so that the first region and second region have an opening. The state after removing the resist 23 concerned selectively is shown in FIG. 24. As shown in FIG. 24, silicon oxide films 21 formed in each of the first region and the second region are exposed.

Figure 25:
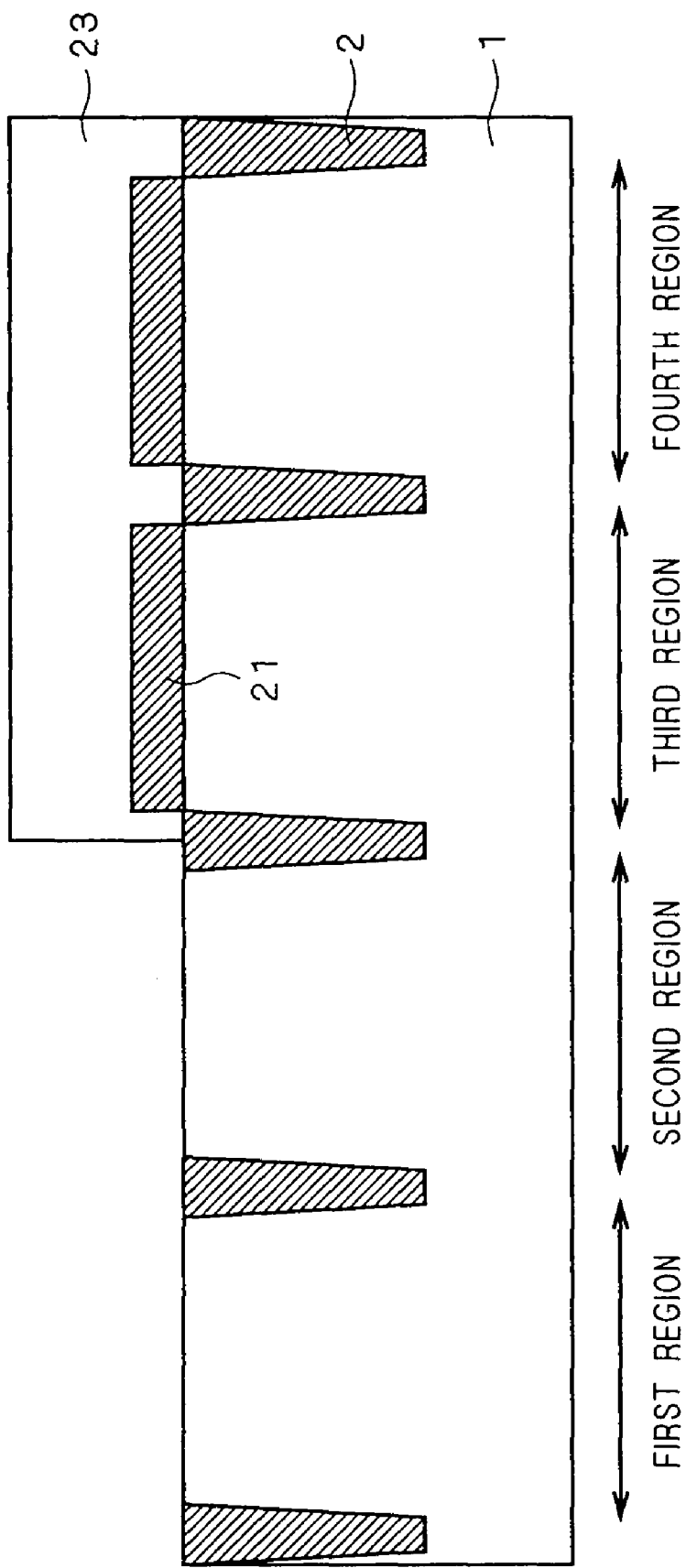

Next, while using the above mentioned resist 23 as a mask, dissolution treatment by diluted fluoric acid is performed to semiconductor substrate 1. Hereby, as shown in FIG. 25, silicon oxide films 21 in the first region and the second region are selectively removed, and the surface of semiconductor substrate 1 of the first region and the second region concerned is exposed again.

Figure 26:
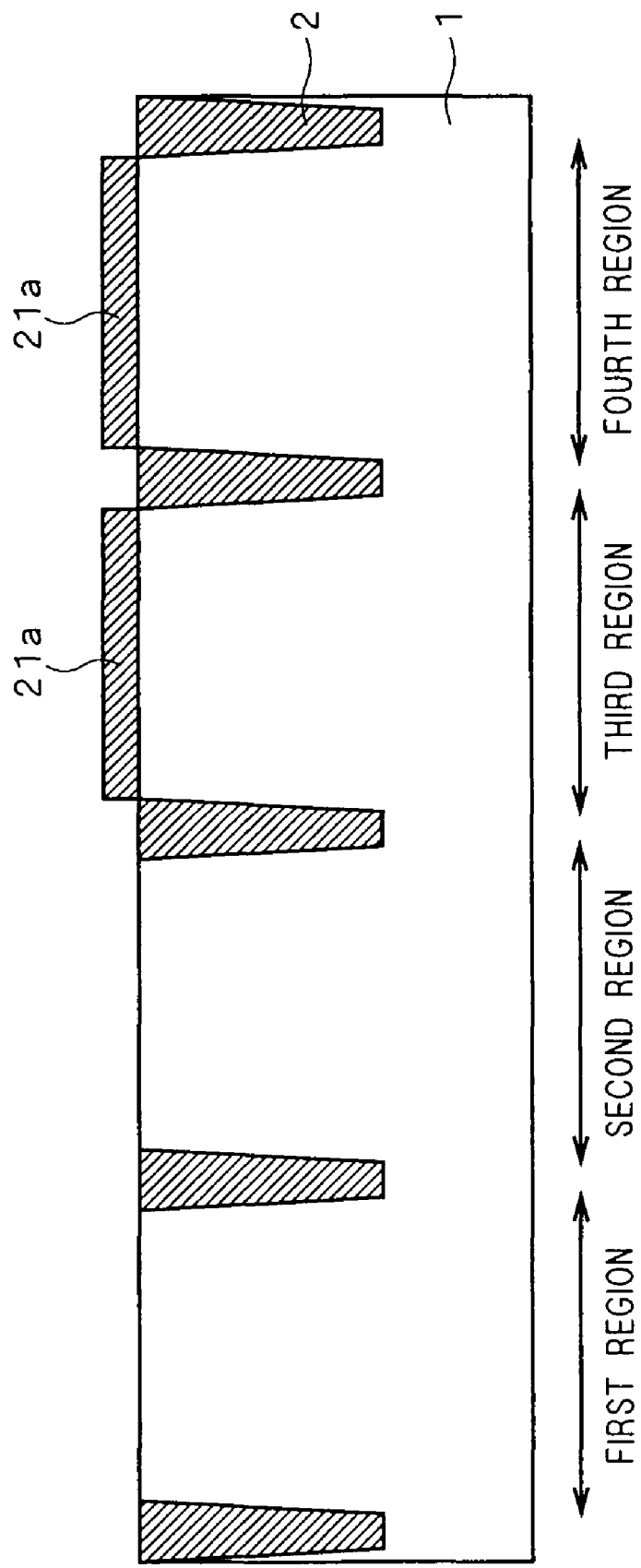

Next, a dissolution treatment using a mixed water solution of sulfuric acid and hydrogen peroxide is performed to semiconductor substrate 1. This removes resist 23. Then, cleaning treatments of semiconductor substrate 1 is performed using a mixed solution of ammonia and hydrogen peroxide and a mixed solution of hydrochloric acid and hydrogen peroxide. By the cleaning treatments concerned, as shown in FIG. 26, the thickness of silicon oxide film 21a currently formed in the third region and the fourth region decreases (for example, it decreases from about 6 nm to about 4 nm).

Here, a mixed water solution of sulfuric acid and hydrogen peroxide is a water solution containing sulfuric acid and a hydrogen peroxide solution. A mixed water solution of ammonia and hydrogen peroxide is a water solution containing ammonia and a hydrogen peroxide solution. A mixed water solution of hydrochloric acid and hydrogen peroxide is a water solution containing hydrochloric acid and a hydrogen peroxide solution.

Figure 27:
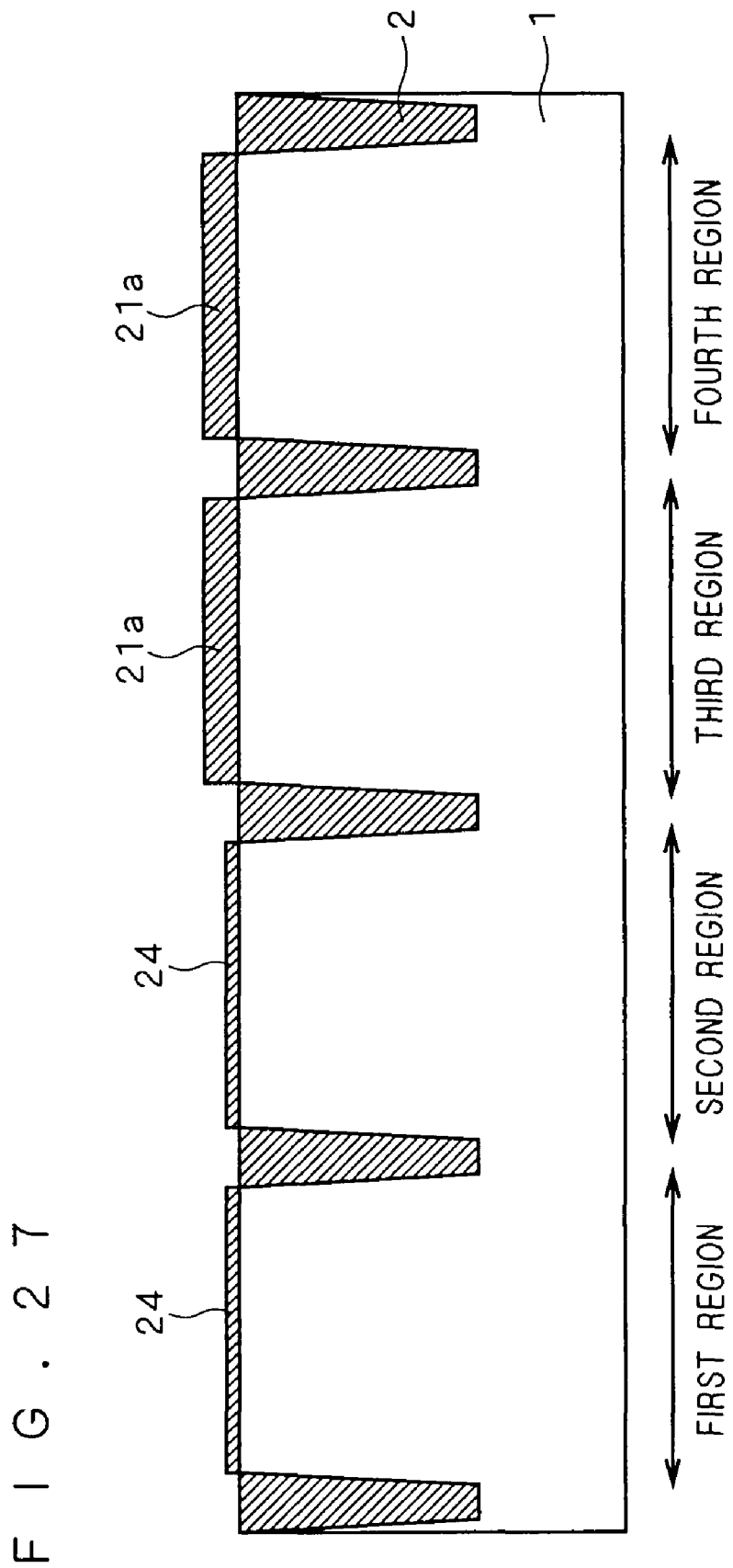

Next, introducing semiconductor substrate 1 in an atmosphere containing oxygen, a heat treatment is performed. Hereby, as shown in FIG. 27, silicon oxide film 24 of predetermined thickness (for example, about 1.4 nm) is formed on semiconductor substrate 1 of the first region and the second region. Halogen (fluorine) 5 is diffused from semiconductor substrate 1 to silicon oxide film 24 during the step of forming the silicon oxide film 24 concerned.

Next, to each silicon oxide films 21a and 24, nitrogen is introduced by the active nitrogen process.

Figure 28:
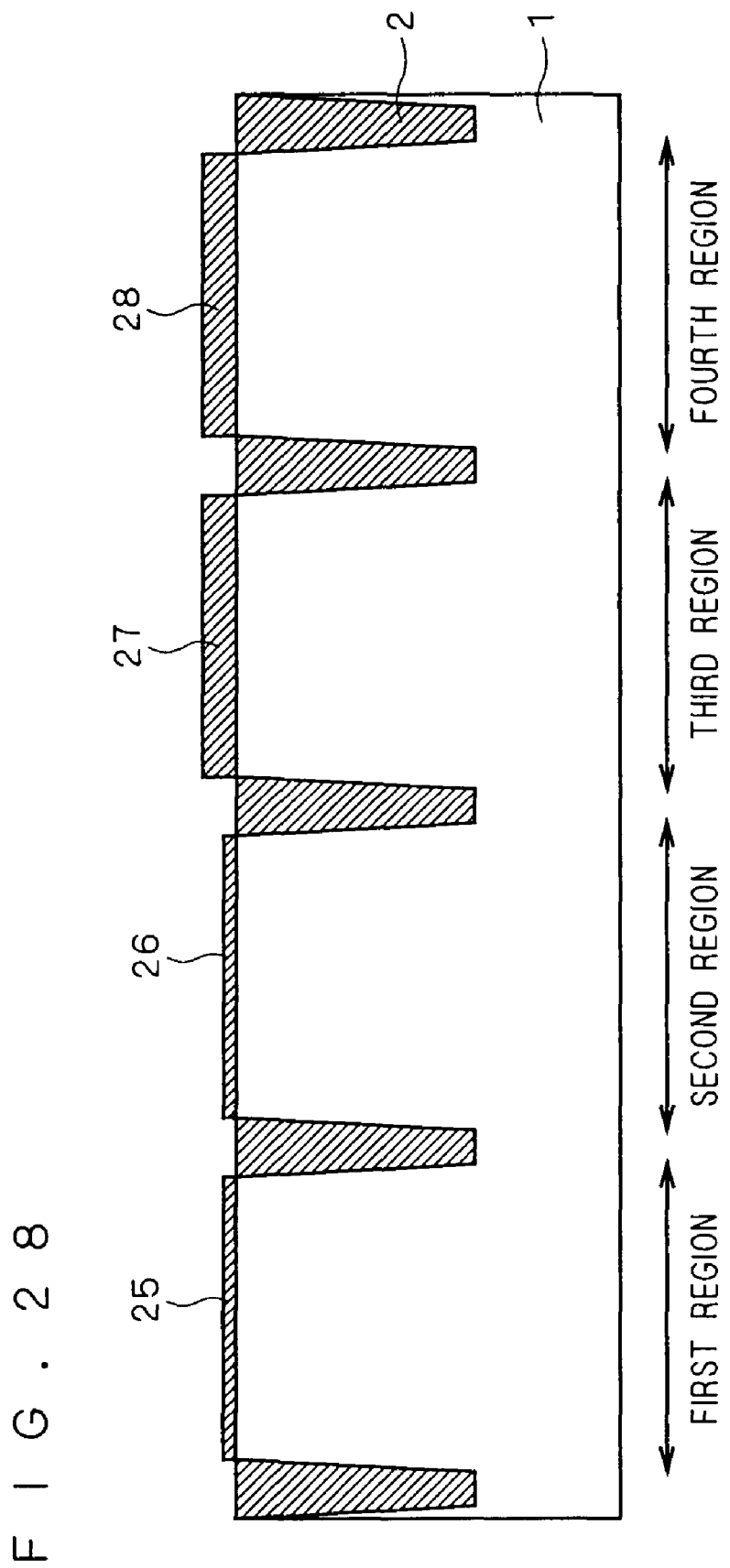

Hereby, as shown in FIG. 28, on semiconductor substrate 1 of the first region, SiON film 25 (it can be grasped as the gate insulating film of a core pMOS transistor) containing halogen 5 is formed. On semiconductor substrate 1 of the second region, SiON film 26 (it can be grasped as the gate insulating film of a core nMOS transistor) which does not contain halogen 5 is formed.

On semiconductor substrate 1 of the third region, SiON film 27 (it can be grasped as the gate insulating film of an I/O pMOS transistor) which does not contain halogen 5 is formed. On semiconductor substrate 1 of the fourth region, SiON film 28 (it can be grasped as the gate insulating film of an I/O nMOS transistor) which does not contain halogen 5 is formed.

Here, as Embodiment 1 explained, halogen 5 is concentrating in near the boundary of semiconductor substrate 1 and SiON film 25.

Equivalent oxide thickness was measured about each SiON films 25-28. The result is as follows.

The equivalent oxide thickness of SiON film 25 is 1.18 nm. The equivalent oxide thickness of SiON film 26 is 1.20 nm. The equivalent oxide thickness of SiON films 27 and 28 whose thickness is 4.20 nm respectively (In the process step explained using FIG. 27, when forming silicon oxide film 24 of about 1.4 nm of thickness on semiconductor substrate 1 of the first region and the second region, the thickness on semiconductor substrate 1 of the third region and the fourth region is set to about 4.0 nm or more).

Since the subsequent formation method of a gate electrode etc. is the same as that of Embodiment 1, explanation here is omitted.

As mentioned above, also in the case of preparing two or more kinds of gate insulating films on a semiconductor substrate, the technology (technology concretely concerning Embodiment 1) concerning the present invention is applicable.

Above, reference was made about the form which applies the technology concerning the present invention when forming two kinds of gate insulating films with which thickness differs on the same semiconductor substrate 1. However, it is natural that, in the case of manufacturing semiconductor integrated circuits for which the gate insulating film which has three or more kinds of different thickness is formed on a semiconductor substrate, the technology concerning the present invention is also applicable.

It is natural that the effect explained by Embodiment 1 is also acquired in the core pMOS transistors in this embodiment.

Above, the introduction of halogens 5, such as fluorine, was performed only to semiconductor substrate 1 of the first region in which a core pMOS transistor is formed. However, the introduction of the halogen 5 concerned may be performed to semiconductor substrate 1 of the other regions.

For example, halogens 5, such as fluorine, may be introduced also to semiconductor substrate 1 of the third region in which I/O pMOS transistors are formed. Thus, the effect of improving the NBTI lifetime of the I/O pMOS transistors can be acquired by introducing halogen 5 to semiconductor substrate 1 of the third region.

However, the following things should be cared about when introducing halogen 5 to semiconductor substrate 1 of the third region.

That is, silicon oxide film 21 formed in the third region is not removed as the process step shown by FIG. 24 and 25 also shows. By the way, a portion of introduced halogen 5 is removed by removal of a silicon oxide (silicon oxide 3 shown in FIG. 5) as the result of a measurement of FIG. 6 and 9 shows, for example.

On the other hand, silicon oxide film 21 formed in the third region is not removed as mentioned above. Therefore, when introducing halogen 5 to semiconductor substrate 1 of the first region, suppose simultaneously that halogen 5 was introduced to semiconductor substrate 1 of the third region. Then, much more halogen 5 will be introduced into the gate insulating film of the I/O pMOS transistors (SiON film 27 of the final state) than into the gate insulating film of the core pMOS transistors (SiON film 25 of a final state).

Thus, when it does not want much halogen 5 to be introduced into the gate insulating film of an I/O pMOS transistor, it is preferred that halogen 5 is introduced separately to the core pMOS and the I/O pMOS regions. That is, the ion implantation process step of the set concerned should be independently performed by making a photo lithography process, and ion introduction process steps, such as an ion implantation, into the set.

Also when a semiconductor device is designed so that the concentration of halogen 5 which the gate insulating film of core pMOS transistors is made to contain and the concentration of halogen 5 which the gate insulating film of I/O pMOS transistors is made to contain may differ, it is desirable to perform the introductory process step of halogen 5 by a separated process (that is, it is desirable to carry out separately independently the ion introduction process step of the above-mentioned set).

Another example of the domain definition of where to introduce fluorine is given.

Usually in leading edge CMOS type semiconductor integrated circuits, transistors having a variety of threshold voltage values are required. And the setting of the threshold voltage concerned is realized by varying the impurity concentration introduced to silicon substrate 1.

The fluorine introduction to the gate insulating film 6 of the core pMOS transistors by the technology concerning the present invention shifts threshold voltage to the positive direction. Therefore, it becomes a fault to shift threshold voltage positively when wanting to set threshold voltage to a greatly negative value. Therefore, it may be more suitable not to introduce fluorine into core pMOS transistors that require greatly negative values.

Another example is given about the domain definition of where to introduce fluorine.

Threshold voltage is shifted to the positive direction also when introducing fluorine to nMOS transistors. Therefore, when setting threshold voltage of nMOS transistors to a greatly positive value, it can become suitable to introduce fluorine also into the nMOS transistors concerned.

Although it is basic to introduce fluorine selectively to the core pMOS region, other domain definitions can also be applied as described above. In particular, the introduction of fluorine may be carried out to all or some of the I/O pMOS region. It may be performed only to a portion, not to all of the core pMOS regions. Further, it may be carried out to a part of nMOS region.

Embodiment 3

In this embodiment, the present invention (technology concretely concerning Embodiment 1) is applied in manufacture of the semiconductor device which has an MOS structure shown below.

Here, as for the above-mentioned MOS structure, a gate insulating film includes a high dielectric constant film. In the high dielectric constant film concerned, the oxide of one of metallic elements is contained, for example among metallic elements, such as Hf, Al, Zr, and La.

Thus, a high dielectric constant film is formed for the lowering of power consumption (suppression of leakage current) of the MOS transistor.

Hereafter, the manufacturing method concerning this embodiment is concretely explained using process step sectional views. Also in this embodiment, it explains as an example like Embodiment 2 bearing in mind manufacture of the digital type semiconductor integrated circuits with which high-speed logic circuits and input output circuits are formed on a semiconductor substrate.

The process steps shown in FIG. 20-28 are common also in this embodiment. Therefore, explanation here is omitted. However, since the nitrogen introduction to a gate insulating film can also be performed after high dielectric constant film formation as it mentions later, it is also possible to omit the nitrogen introduction from the process steps shown in drawing 20 to 28.

Next, a HfSiO thin film is deposited, for example in about 1.2 nm thickness on semiconductor substrate 1 shown in FIG. 28, for example. The atomic composition ratio of Hf and Si in the above-mentioned HfSiO thin film is about 1:1.

A metal organic chemical vapor deposition method (MOCVD) using HTB (hafnium tetra-tertiary butoxide) and TDMAS (tetraxy dimethyl amide silicon) as a source raw material as a deposition method of the above-mentioned thin film here, for example is employable.

In the above MOCVD method, other source raw materials may also be adopted. Methods, such as an atomic-layer-deposition method (ALD: Atomic Layer Deposition), may also be adopted as a deposition method of the above-mentioned thin film.

Figure 29:
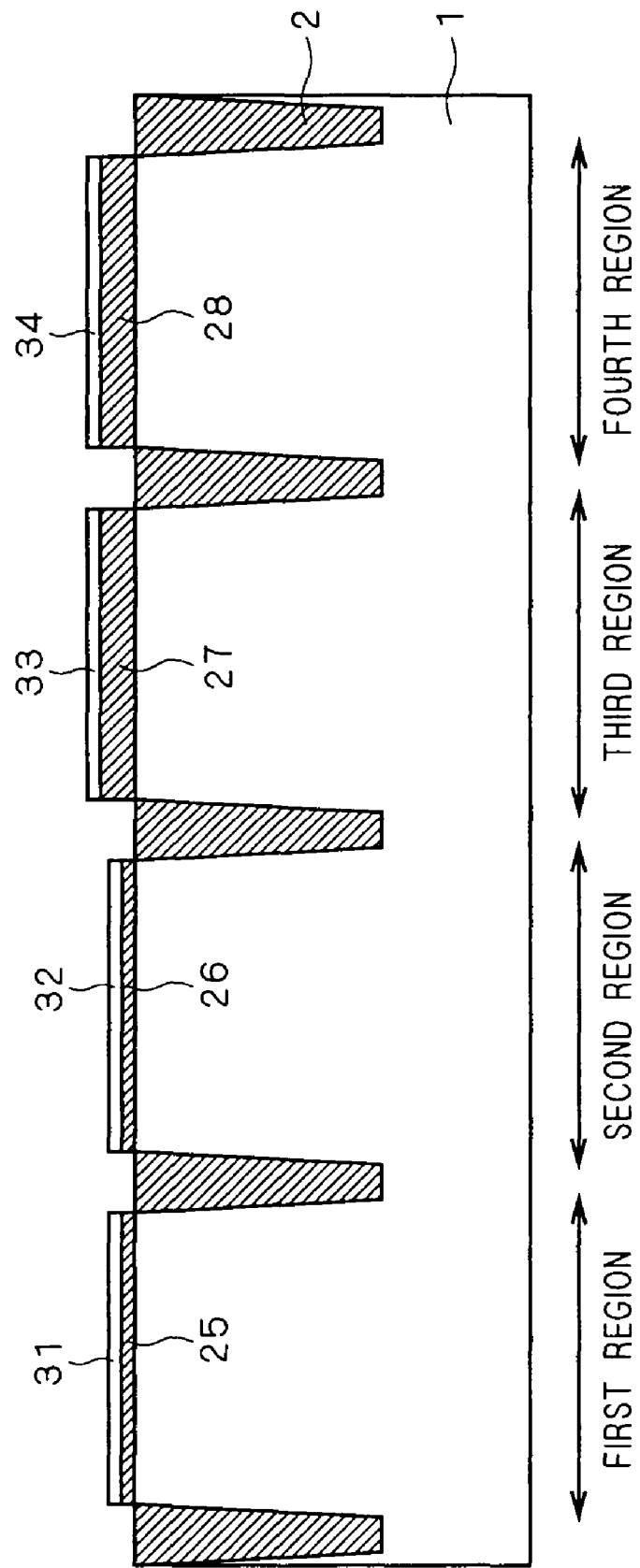
FIG. 29 is a sectional view for explaining the manufacturing method of, such as a CMOS type semiconductor device concerning Embodiment 3.

Next, nitrogen is introduced into the HFSiO thin film by an active nitrogen process etc. Hereby, as shown in FIG. 29, on SiON film 25, HfSiON thin film (high dielectric constant film) 31 is formed. On SiON film 26, HFSiON thin film (high dielectric constant film) 32 is formed. On SiON film 27, HfSiON thin film (high dielectric constant film) 33 is formed. On SiON film 28, HfSiON thin film (high dielectric constant film) 34 is formed.

Although the HfSiON thin film is formed also on isolation 2, it will be itself removed at a later process step. Therefore, the HfSiON film on isolation film 2 is not illustrated here for simplification. Equivalent oxide thickness was measured about the laminated film (it can be grasped as a gate insulating film) which has the thickness exemplified above and which comprises a SiON film and a HfSiON thin film.

As a result, the equivalent oxide thickness of the above-mentioned laminated film formed in the first and the second regions was 1.6 nm. The equivalent oxide thickness of the above-mentioned laminated film formed in the third and fourth regions was 4.7 nm.

Then, a gate electrode is respectively formed on the HfSiON thin film 31-34 concerned, and the manufacturing method of a semiconductor device is continued. However, since the manufacturing method concerned is the same as that of Embodiment 1, detailed explanation is omitted.

In this embodiment, titanium nitride, tantalum nitride, hafnium nitride, nickel silicide, cobalt silicide, etc. can be used as a gate electrode material, in addition to polycrystalline silicon.

The above explanation is for the case of applying the present invention to manufacture of the CMOS type semiconductor device which has a high dielectric constant film in an MOS structure. Also in the CMOS type semiconductor device manufactured by the above-mentioned manufacturing method, the same effect as Embodiment 1 is acquired.

The HfSiON thin film and the SiON film mutually diffuse due to the heat loads of the process steps after forming the HfSiON film. Therefore, the boundary of both films does not become completely clear.

When the above-mentioned manufacturing method is adopted, the gate insulating film structure has the following features. That is, the concentration of the halogen in near the boundary of semiconductor substrate 1 and SiON film 25 is higher than the concentration of the halogen near the boundary of the gate electrode (the gate electrode concerned is formed on high dielectric constant film 31 although not illustrated in FIG. 29), and high dielectric constant film 31.

The amount of NBTI degradation was measured about the core pMOS transistor into which halogen 5 (fluorine) was introduced by the above-mentioned manufacturing method. For comparison, NBTI measurement was also done on the core pMOS transistor in which halogen 5 (fluorine) was not introduced.

The dimensions of the measured core pMOS transistors are gate length 0.2 µm and gate width 10 µm. The measurement condition is temperature 125° C., gate voltage-1.6V, and time for 10000 seconds. Shifts in threshold voltage were measured under the conditions concerned.

As a result, it became clear that the core pMOS transistor which has the high dielectric constant film into which halogen 5 was introduced according to this embodiment shows less NBTI degradation than that without introducing halogen 5. When the threshold voltage shift of the core pMOS transistor when not introducing halogen 5 was concretely set to 100, the threshold voltage shift of the core pMOS transistor to which the introduction of halogen (fluorine) 5 shown in this embodiment was performed was 80.

Embodiment 4

This embodiment explains the case where a series of process steps that introduce nitrogen into semiconductor substrate 1 of the second region selectively are added, in the manufacturing method concerning Embodiment 2. Hereafter, the manufacturing method concerning this embodiment is explained using process step sectional views.

Since the process steps of FIG. 20-23 are the same as those of Embodiment 2, explanation here is omitted. Note that the thickness of silicon oxide film 21 is about 10 nm in this embodiment. Implantation of halogens 5 to semiconductor substrate 1 of the first region, such as fluorine, was performed with the acceleration voltage of about 16 kV.

Figure 30:
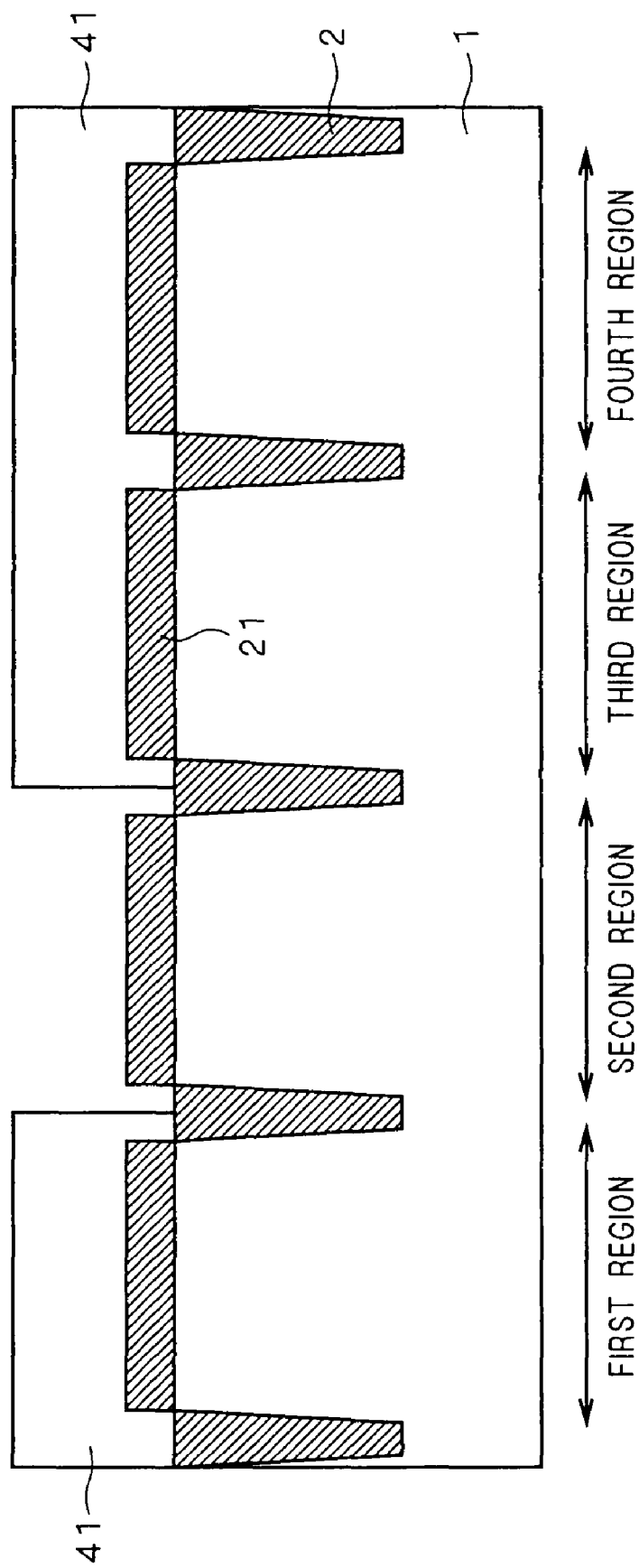

Now, resist 22 is removed after the introduction of halogen 5 as shown by FIG. 23. Then, again, resist 41 is applied to semiconductor substrate 1 so that silicon oxide film 21 is covered. And by using the photo lithography technology, the resist 41 concerned is selectively removed so that the second region may have an opening. The state after removing the resist 41 concerned selectively is shown in FIG. 30. As shown in FIG. 30, silicon oxide film 21 formed in the second region is exposed.

Next, as shown in FIG. 31, nitrogen ions 42 ($N_2$ ion charged in monovalence) are implanted to semiconductor substrate 1 of the second region using the above mentioned resist 41 as a mask. The introduction of the nitrogen ion 42 concerned can be performed under the conditions that the dosage of nitrogen ion is about $1\times10^{15}/cm^2$ and the acceleration voltage is about 18 kV, for example.

Next, resist 41 is removed. Then, a heat treatment is performed at a temperature of about 900° C. for about 10 minutes in a nitrogen atmosphere. Hereby, the damage of semiconductor substrate 1 induced by the ion-implantation process can be recovered.

Then, the CMOS type semiconductor device concerning this embodiment etc. is completed by employing the process steps shown after FIG. 24. It is natural that the same effect as Embodiment 1 is acquired in the core pMOS transistor.

The thickness of silicon oxide film 21 currently formed in the third region and fourth region decreases by the cleaning treatments of semiconductor substrate 1 using a mixed solution of ammonia and hydrogen peroxide and a mixed solution of hydrochloric acid and hydrogen peroxide (for example, it decreases from about 10 nm to about 6 nm).

In the manufacturing method concerning this embodiment, as explained using FIG. 31, in addition to the active nitrogen process, nitrogen is further introduced by the ion implantation to semiconductor substrate 1 of the second region. Here, when a gate insulating film is formed on semiconductor substrate 1 of the second region, the introduced nitrogen diffuses into the gate insulating film (especially, near the boundary of semiconductor substrate 1 and the gate insulating film).

By the above, the nitrogen concentration in the gate insulating film of the core nMOS transistors is made higher than that of the core pMOS transistors.

Equivalent oxide thickness was measured about the SiON films (it can be grasped as a gate insulating film).

As a result, the equivalent oxide thickness of the SiON film formed in the first region was 1.18 nm. The equivalent oxide thickness of the SiON film formed in the second region was 1.15 nm. The equivalent oxide thickness of the above-mentioned laminated film formed in the third region and fourth region was 5.5 nm.

In this way, gate leakage current of the core nMOS transistor decreased by about 70%, and drain current increased by about 4% by selectively incorporating nitrogen to semiconductor substrate 1 of the second region.

The above mentioned introduction of nitrogen can be performed to semiconductor substrate 1 of desired regions while the above explanation is one of the typical cases. For example, it is also possible to introduce nitrogen only to a portion of the second region.

The invention claimed is:

1. A manufacturing method of a CMOS type semiconductor device, comprising the steps of:
    (a) preparing a semiconductor substrate which has pMOS transistor formation areas and nMOS transistor formation areas;
    (b) forming an insulating film over the semiconductor substrate;
    (c) after step (b), introducing halogen to the semiconductor substrate of all or partial areas of the pMOS transistor formation area;
    (d) after step (c), removing the insulating film;
    (e) after step (d), forming a first gate insulating film over the semiconductor substrate of the pMOS transistor formation area after the step (d);
    (f) after step (e), introducing nitrogen to the first gate insulating film;
    (g) after step (f), forming a first gate electrode over the first gate insulating film; and
    (h) after step (g), incorporating boron into the first gate electrode.

2. A manufacturing method of a CMOS type semiconductor device according to claim 1, wherein
    the halogen is not introduced to the semiconductor substrate of all or partial areas of the nMOS transistor formation area.

3. A manufacturing method of a CMOS type semiconductor device according to claim 1, wherein
    the halogen is fluorine.

4. A manufacturing method of a CMOS type semiconductor device according to claim 1, wherein
    the step (f) is a step that introduces nitrogen to the first gate insulating film by an active nitrogen process.

5. A manufacturing method of a CMOS type semiconductor device according to claim 1, wherein
    the step (e) is a step which forms a second gate insulating film over the semiconductor substrate of the nMOS transistor formation area at a same time with the first gate insulating film formation.

6. A manufacturing method of a CMOS type semiconductor device according to claim 2, wherein
    the step (c) comprises the steps of
    (c-1) forming a mask that has openings where the pMOS formation areas are exposed over the semiconductor substrate; and
    (c-2) introducing the halogen by performing an ion-implantation process to the semiconductor substrate on which the mask is formed.

7. A manufacturing method of a CMOS type semiconductor device according to claim 2, wherein the step (c) comprising the steps of:
    (c-1) forming a mask that has openings where the pMOS formation areas are exposed over the semiconductor substrate; and
    (c-2) introducing the halogen by performing an active halogen process to the semiconductor substrate on which the mask is formed.

* * * * *